(12) United States Patent
Hitomi et al.

(10) Patent No.: US 11,855,033 B2
(45) Date of Patent: Dec. 26, 2023

(54) POWER SEMICONDUCTOR MODULE AND POWER CONVERTER

(71) Applicant: Mitsubishi Electric Corporation, Tokyo (JP)

(72) Inventors: Haruko Hitomi, Tokyo (JP); Kozo Harada, Tokyo (JP); Ken Sakamoto, Tokyo (JP)

(73) Assignee: MITSUBISHI ELECTRIC CORPORATION, Tokyo (JP)

(*) Notice: Subject to any disclaimer, the term of this patent is extended or adjusted under 35 U.S.C. 154(b) by 291 days.

(21) Appl. No.: 17/440,790

(22) PCT Filed: May 30, 2019

(86) PCT No.: PCT/JP2019/021601
§ 371 (c)(1),
(2) Date: Sep. 20, 2021

(87) PCT Pub. No.: WO2020/240790
PCT Pub. Date: Dec. 3, 2020

(65) Prior Publication Data
US 2022/0165700 A1  May 26, 2022

(51) Int. Cl.
*H01L 23/00* (2006.01)
*H01L 23/18* (2006.01)
(Continued)

(52) U.S. Cl.
CPC .............. *H01L 24/48* (2013.01); *H01L 23/18* (2013.01); *H01L 23/3107* (2013.01);
(Continued)

(58) Field of Classification Search
CPC ......... H01L 24/48; H01L 24/85; H01L 24/32; H01L 24/73; H01L 23/18; H01L 23/3107;
(Continued)

(56) References Cited

U.S. PATENT DOCUMENTS 6,849,930 B2 * 2/2005 Nakajima ......... H01L 23/49524
257/784
8,847,410 B2 * 9/2014 Miyoshi ................. H01L 24/49
257/784

FOREIGN PATENT DOCUMENTS

EP          1739740 A2    1/2007
JP       5-121614 A       5/1993
JP     2007-012831 A      1/2007

OTHER PUBLICATIONS

International Search Report and Written Opinion dated Aug. 27, 2019, received for PCT Application PCT/JP2019/021601, Filed on May 30, 2019, 8 pages including English Translation.

* cited by examiner

*Primary Examiner* — Marc Anthony Armand
(74) *Attorney, Agent, or Firm* — XSENSUS LLP

(57) ABSTRACT

The conductive wire is bonded to the front electrode of the semiconductor device at the bonding section. The first resin member covers at least one end portion of two end portions of the bonding section, the first surface of the front electrode, and the second surface of the conductive wire. The second resin member covers the bent portion of the first resin member. The first resin member has a higher break elongation and a higher break strength than the second resin member. The second tensile elastic modulus of the second resin member is greater than the first tensile elastic modulus of the first resin member. Thereby, the reliability of the power semiconductor module is improved.

15 Claims, 20 Drawing Sheets

(51) Int. Cl.
*H01L 23/31* (2006.01)
*H01L 23/48* (2006.01)
(52) U.S. Cl.
CPC .............. *H01L 23/48* (2013.01); *H01L 24/85* (2013.01); *H01L 2224/48227* (2013.01); *H01L 2224/85909* (2013.01); *H01L 2924/181* (2013.01)
(58) Field of Classification Search
CPC ..... H01L 23/48; H01L 23/36; H01L 23/3735; H01L 23/053
See application file for complete search history.

POWER SEMICONDUCTOR MODULE AND POWER CONVERTER

CROSS-REFERENCE TO RELATED APPLICATION

The present application is based on PCT filing PCT/JP2019/021601, filed May 30, 2019, the entire contents of which are incorporated herein by reference.

TECHNICAL FIELD

The present invention relates to a power semiconductor module and a power converter.

BACKGROUND ART

Japanese Patent Laying-Open No. 2007-12831 (PTL 1) discloses a power semiconductor device including an insulating circuit board, a semiconductor device, and a metal wire. The metal wire is bonded to the semiconductor device. The bonding section between the semiconductor device and the metal wire is covered with an insulating resin. The insulating resin is polyamide resin or polyamide-polyimide resin.

CITATION LIST

Patent Literature

PTL 1: Japanese Patent Laying-Open No. 2007-12831

SUMMARY OF INVENTION

Technical Problem

Due to the difference between the coefficient of thermal expansion of the semiconductor device and the coefficient of thermal expansion of the metal wire, a stress is repeatedly applied to the bonding section between the semiconductor device and the metal wire when the power semiconductor device is being used. It is difficult for the insulating resin included in the power semiconductor device disclosed in PTL 1 to prevent cracks from occurring in the bonding section between the semiconductor device and the metal wire. Thus, the power semiconductor device disclosed in PTL 1 is low in reliability. An object of the present invention is to provide a power semiconductor module and a power converter with improved reliability.

Solution to Problem

The power semiconductor module of the present invention includes a semiconductor device, at least one conductive wire, a first resin member, a second resin member, and a third resin member. The semiconductor device is provided with a front electrode. The at least one conductive wire is bonded to the front electrode at a bonding section. The third resin member seals the semiconductor device, the first resin member, and the second resin member. The first resin member extends along the first surface of the front electrode and the second surface of the conductive wire, and is bent at at least one end portion of two end portions of the bonding section in the longitudinal direction of the conductive wire. The first surface of the front electrode is connected to at least one end portion of the two end portions of the bonding section, and faces the conductive wire. The second surface of the conductive wire is connected to at least one end portion of the two end portions of the bonding section, and faces the front electrode. The first resin member covers at least one end portion of the two end portions of the bonding section, the first surface and the second surface. The second resin member covers the bent portion of the first resin member. The first break elongation of the first resin member is greater than the second break elongation of the second resin member. The first break strength of the first resin member is greater than the second break strength of the second resin member. The second tensile elastic modulus of the second resin member is greater than the first tensile elastic modulus of the first resin member.

A power converter of the present invention includes a main conversion circuit and a control circuit. The main conversion circuit includes the power semiconductor module of the present invention, and is configured to convert an input power and output the converted power. The control circuit is configured to output a control signal for controlling the main conversion circuit to the main conversion circuit.

Advantageous Effects of Invention

The first break elongation of the first resin member is greater than the second break elongation of the second resin member. The first break strength of the first resin member is greater than the second break strength of the second resin member. Therefore, even when the power semiconductor module is subjected to a heat cycle, the first resin member may continue to fix the conductive wire to the front electrode of the semiconductor device without breaking. The second tensile elastic modulus of the second resin member is greater than the first tensile elastic modulus of the first resin member. Therefore, when the power semiconductor module is subjected to a heat cycle, the second resin member may prevent the breaking of the first resin member at the bent portion of the first resin member where it is most likely to break. As a result, it is possible to prevent cracks from occurring in the bonding section. Thereby, the reliability of the power semiconductor module and the power converter of the present invention is improved.

DESCRIPTION OF EMBODIMENTS

Figure 1:
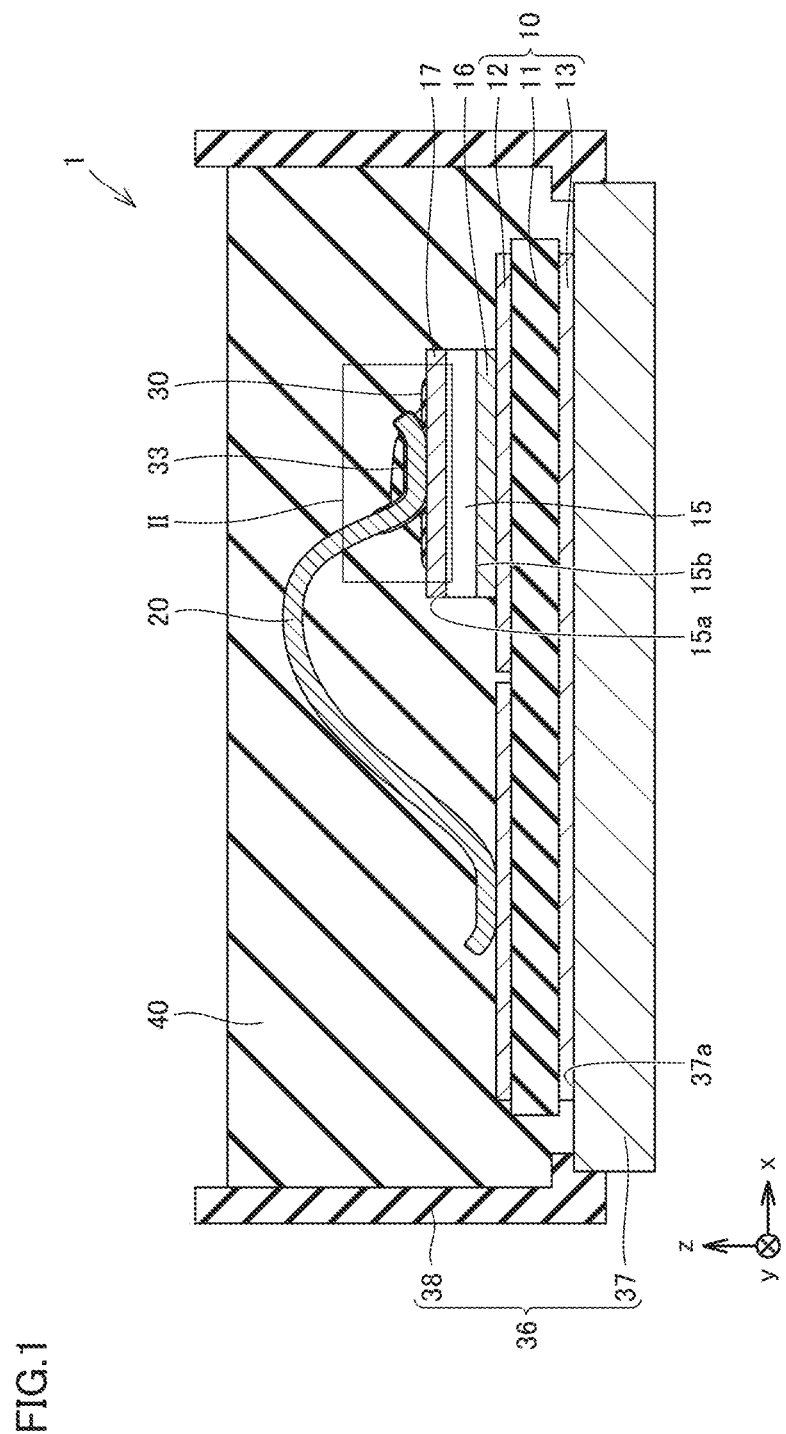
FIG. 1 is a cross-sectional view schematically illustrating a power semiconductor module according to a first embodiment.

Hereinafter, embodiments of the present invention will be described. The same components are denoted by the same reference numerals, and the description thereof will not be repeated.

First Embodiment

A power semiconductor module 1 according to a first embodiment will be described with reference to FIGS. 1 to 12. As illustrated in FIG. 1, the power semiconductor module 1 mainly includes an insulating circuit board 10, a semiconductor device 15, at least one conductive wire 20, a first resin member 30, a second resin member 33, and a third resin member 40. The power semiconductor module 1 may further include a heat sink 37. The power semiconductor module 1 may further include an envelope 38.

The insulating circuit board 10 includes an insulating board 11. The insulating board 11 extends in a first direction (x direction) and a second direction (y direction) perpendicular to the first direction. The insulating board 11 includes a front surface and a back surface opposite to the front surface. The insulating board 11 may be made of an inorganic material (ceramic material) such as alumina ($Al_2O_3$), aluminum nitride (AlN), or silicon nitride ($Si_3N_4$). The insulating circuit board 10 includes a conductive circuit pattern 12 and a conductive plate 13. The conductive circuit pattern 12 is provided on the front surface of the insulating board 11. The conductive plate 13 is provided on the back surface of the insulating board 11. The conductive circuit pattern 12 and the conductive plate 13 may be made of a metal material such as copper (Cu) or aluminum (Al).

The semiconductor device 15 is a power semiconductor device. The semiconductor device 15 is, for example, a switching element such as an insulated gate bipolar transistor (IGBT) or a metal oxide semiconductor field effect transistor (MOSFET), or a rectifying device such as a Schottky barrier diode. The semiconductor device 15 may be made of silicon or a wide bandgap semiconductor material such as silicon carbide, gallium nitride or diamond.

The semiconductor device 15 includes a front electrode 17. The semiconductor device 15 may further include a back electrode 16. The semiconductor device 15 may have a vertical structure. The front electrode 17 and the back electrode 16 may be made of, for example, an Al alloy containing Si. The front electrode 17 and the back electrode 16 each may be covered with a coating layer (not shown). The coating layer may be, for example, a nickel (Ni) layer, a gold (Au) layer, or a laminate thereof.

The semiconductor device 15 is bonded to the conductive circuit pattern 12 of the insulating circuit board 10. Specifically, the back electrode 16 of the semiconductor device 15 is bonded to the conductive circuit pattern 12 by using a bonding member (not shown) such as solder or a sintered body of metal fine particles. The front electrode 17 includes a first surface 17a. The first surface 17a of the front electrode 17 is connected to at least one end portion of two end portions 21p and 21q of a bonding section 21 in the longitudinal direction (the first direction, i.e., the x direction) of the conductive wire 20, and faces the conductive wire 20.

The conductive wire 20 is bonded to the front electrode 17 of the semiconductor device 15 at the bonding section 21. The conductive wire 20 is bonded to the conductive circuit pattern 12. The conductive wire 20 may be bonded to the front electrode 17 of the semiconductor device 15 and the conductive circuit pattern 12 by using a wire bonder. The conductive wire 20 may be made of a metal material such as gold (Au), aluminum (Al), or copper (Cu).

Figure 2:
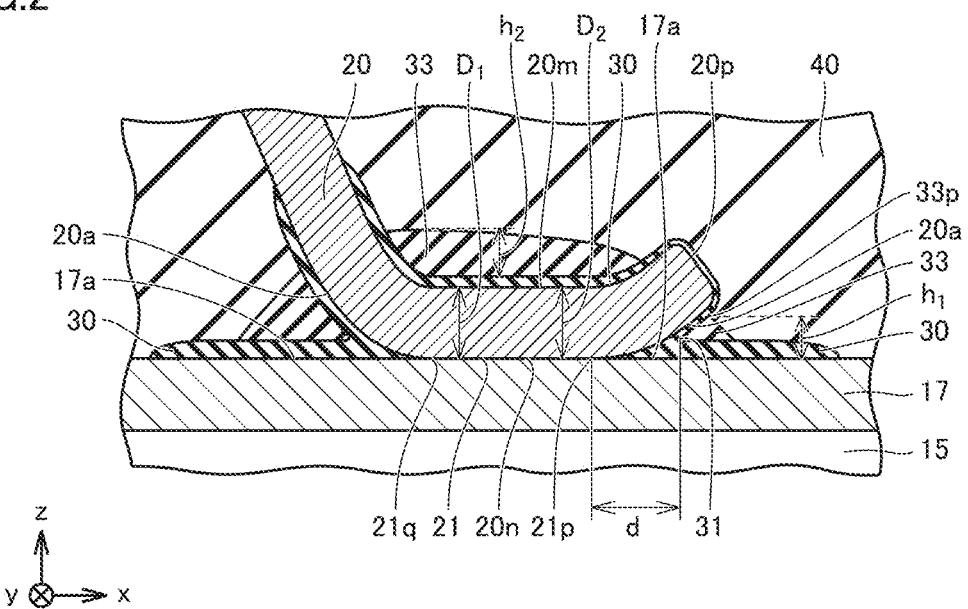
FIG. 2 is a partially enlarged cross-sectional view schematically illustrating the power semiconductor module according to the first embodiment in a region II illustrated in FIG. 1, which is a partially enlarged cross-sectional view schematically illustrating the power semiconductor module according to the first embodiment taken along a section line II-II illustrated in FIG. 3.
Figure 3:
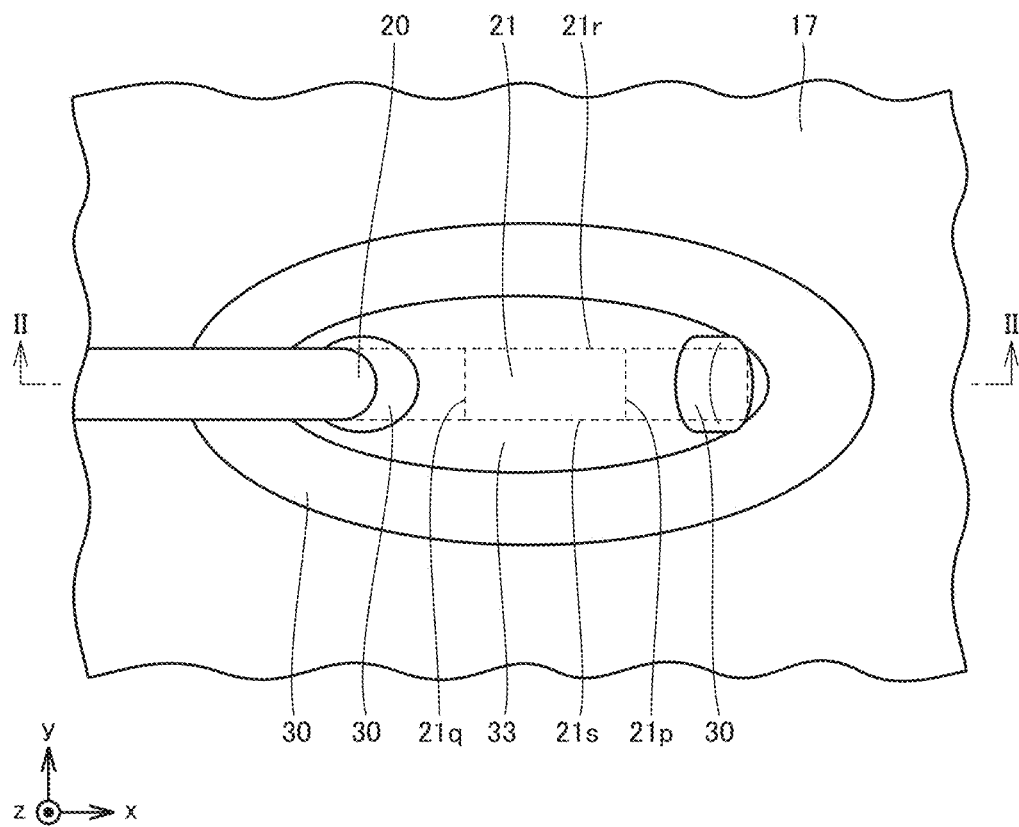
FIG. 3 is a partially enlarged plan view schematically illustrating the power semiconductor module according to the first embodiment.
Figure 4:
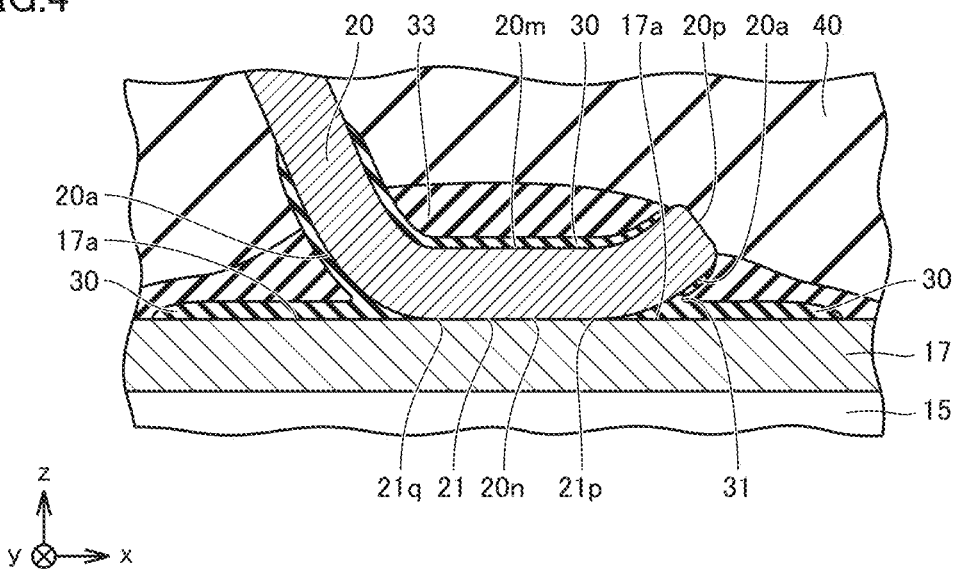
FIG. 4 is a partially enlarged cross-sectional view schematically illustrating a power semiconductor module according to a first modification of the first embodiment.
Figure 5:
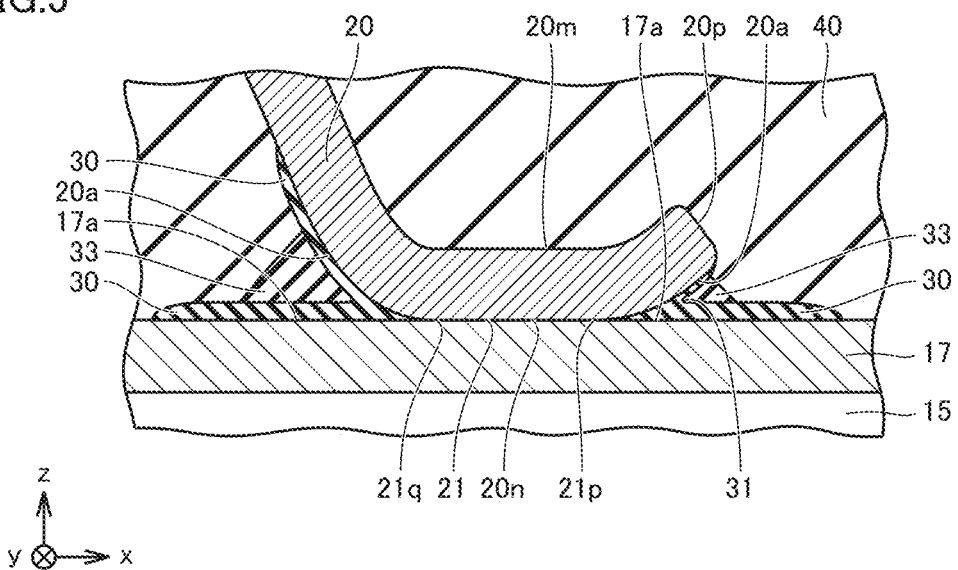
FIG. 5 is a partially enlarged cross-sectional view schematically illustrating a power semiconductor module according to a second modification of the first embodiment taken along a cross-sectional line V-V illustrated in FIG. 6.
Figure 6:
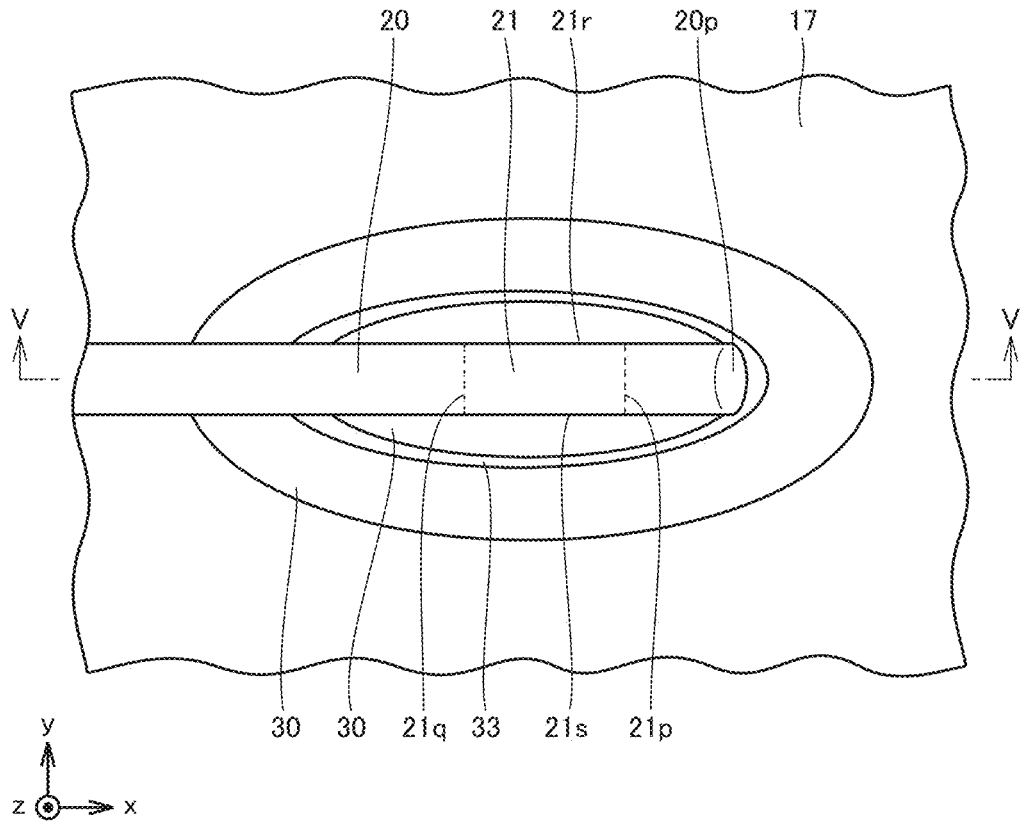
FIG. 6 is a partially enlarged plan view schematically illustrating a power semiconductor module according to a second modification of the first embodiment.

As illustrated in FIG. 2, the conductive wire 20 includes a second surface 20a, a third surface 20m, and a fourth surface 20n. The second surface 20a of the conductive wire 20 is connected to at least one end portion of the two end portions 21p and 21q of the bonding section 21 in the longitudinal direction (the first direction, i.e., the x direction) of the conductive wire 20, and faces the front electrode 17. The fourth surface 20n of the conductive wire 20 is in contact with the front electrode 17 at the bonding section 21. The third surface 20m of the conductive wire 20 is opposite to the fourth surface 20n of the conductive wire 20.

The conductive wire 20 has an end 20p proximal to the bonding section 21. The two end portions 21p and 21q of the bonding section 21 in the longitudinal direction (the first direction, i.e., the x direction) of the conductive wire 20 are an end portion 21p proximal to the end 20p of the conductive wire 20 and an end portion 21q distal to the end 20p of the conductive wire 20. The end portion 21q of the bonding section 21 is opposite to the end portion 21p of the bonding section 21 in the longitudinal direction (the first direction, i.e., the x direction) of the conductive wire 20.

As illustrated in FIG. 2, the first resin member 30 extends along the first surface 17a of the front electrode 17 and the second surface 20a of the conductive wire 20, and is bent at at least one end portion of the two end portions 21p and 21q of the bonding section 21 in the longitudinal direction of the conductive wire 20. The distance d between at least one end portion of the two end portions 21p and 21q of the bonding section 21 and the bent portion 31 of the first resin member 30 in the longitudinal direction of the conductive wire 20 may be 150 μm or less. The distance d may be 100 μm or less.

The first resin member 30 covers at least one end portion of the two end portions 21p and 21q of the bonding section 21, the first surface 17a of the front electrode 17, and the second surface 20a of the conductive wire 20. At least one end portion of the two end portions 21p and 21q of the bonding section 21 may be the two end portions 21p and 21q of the bonding section 21. The first resin member 30 may further cover side portions 21r and 21s of the bonding section 21 connecting the two end portions 21p and 21q of the bonding section 21 to each other. The first resin member 30 may cover the entire outer peripheral surface of the bonding section 21. The first resin member 30 may further cover the third surface 20m of the conductive wire 20. The first resin member 30 may further cover the end 20p of the conductive wire 20. As illustrated in the first modification of the present embodiment in FIG. 4, the end 20p of the conductive wire 20 may be exposed from the first resin member 30.

As illustrated in FIG. 2, a part of the first resin member 30 may be exposed from the second resin member 33. A part of the first resin member 30 extending on the first surface 17a of the front electrode 17 may be exposed from the second resin member 33. As illustrated in the first modification of the present embodiment in FIG. 4, the entire part of the first resin member 30 extending on the first surface 17a of the front electrode 17 may be covered with the second resin member 33. As illustrated in FIG. 2, the first resin member 30 formed on the end 20p of the conductive wire 20 may be exposed from the second resin member 33. The thickness of the first resin member 30 may be smaller than the maximum thickness $D_2$ of the conductive wire 20 located on the bonding section 21. The thickness of the first resin member 30 may be smaller than a half of the maximum thickness $D_2$ of the conductive wire 20 located on the bonding section 21.

The first resin member 30 is made of, for example, an insulating resin such as polyimide resin. The first resin member 30 may be made of polyimide resin having a siloxane skeleton. The siloxane skeleton allows the first resin member 30 to have flexibility and adhesion to the conductive wire 20 and the front electrode 17.

As illustrated in FIG. 2, the second resin member 33 covers the bent portion 31 of the first resin member 30. At least one end portion of the two end portions 21p and 21q of the bonding section 21 is double sealed by the first resin member 30 and the second resin member 33. The two end portions 21p and 21q of the bonding section 21 may be double sealed by the first resin member 30 and the second resin member 33. The side portions 21r and 21s of the bonding section 21 may be double sealed by the first resin member 30 and the second resin member 33. The entire outer peripheral surface of the bonding section 21 may be double sealed by the first resin member 30 and the second resin member 33. The second resin member 33 is made of an insulating resin such as epoxy resin. The outer surface of the second resin member 33 may have a convex shape protruding outward (i.e., toward the third resin member 40).

A minimum height $h_1$ of a top portion 33p of the second resin member 33 located between the first surface 17a of the front electrode 17 and the second surface 20a of the conductive wire 20 relative to the first surface 17a of the front electrode 17 may be greater than a half of the minimum thickness $D_1$ of the conductive wire 20 located on the bonding section 21. A maximum thickness $h_2$ of the second resin member 33 located on the third surface 20m of the conductive wire 20 is equal to or less than twice the maximum thickness $D_2$ of the conductive wire 20 located on the bonding section 21. The maximum thickness $h_2$ of the second resin member 33 may be is equal to or less than 1.5 times the maximum thickness $D_2$ of the conductive wire 20. The maximum thickness $h_2$ of the second resin member 33 may be equal to or less than the maximum thickness $D_2$ of the conductive wire 20. As illustrated in the second modification of the present embodiment in FIGS. 5 and 6, the third surface 20m of the conductive wire 20 may be exposed from the second resin member 33. The maximum thickness $h_2$ of the second resin member 33 may be zero.

The first break elongation of the first resin member 30 is greater than the second break elongation of the second resin member 33. The first break elongation of the first resin member 30 is, for example, 20% or more. The first break elongation of the first resin member 30 may be 50% or more, or may be 80% or more. The first break strength of the first resin member 30 is greater than the second break strength of the second resin member 33. The first break strength of the first resin member 30 is, for example, 100 MPa or more. The first break strength of the first resin member 30 may be 150 MPa or more. The first break elongation and the first break strength of the first resin member 30 are measured according to ASTM D882. The second break elongation and the second break strength of the second resin member 33 are measured according to JIS K 7161-1.

The second tensile elastic modulus of the second resin member 33 is greater than the first tensile elastic modulus of the first resin member 30. The second tensile elastic modulus of the second resin member 33 is, for example, 5 GPa or more. The second tensile elastic modulus of the second resin member 33 may be 30 GPa or less, for example. The first tensile elastic modulus of the first resin member 30 is measured according to ASTM D882. The second tensile elastic modulus of the second resin member 33 is measured according to JIS K 7161-1.

The second resin member 33 contains a filler at a concentration higher than that in the first resin member 30. The first resin member 30 may include, for example, a first filler made of metal or ceramic. The first resin member 30 may not contain a filler. The second resin member 33 may contain a second filler such as silica or alumina.

Since the first resin member 30 does not contain a filler or only contains a filler at a low concentration, it is possible to increase the first break elongation and the first break strength of the first resin member 30. However, since the first resin member 30 does not contain a filler or only contains a filler at a low concentration, it is difficult to increase the first tensile elastic modulus of the first resin member 30. When the power semiconductor module 1 is subjected to a heat cycle, it is difficult for the first resin member 30 itself to sufficiently prevent the deformation of the conductive wire 20 caused by the difference in thermal expansion coefficient between the semiconductor device 15, the conductive wire 20 and the third resin member 40.

Since the second resin member 33 contains a filler at a concentration higher than that in the first resin member 30, the second tensile elastic modulus of the second resin member 33 may be made greater than the first tensile elastic modulus of the first resin member 30. When the power semiconductor module 1 is subjected to a heat cycle, the second resin member 33 having the second tensile elastic modulus greater than the first tensile elastic modulus of the first resin member 30 may sufficiently prevent the deformation of the conductive wire 20. The second resin member 33 may prevent the breaking of the first resin member 30 caused by the deformation of the conductive wire 20.

Each of the first resin member 30 and the second resin member 33 may have a glass transition temperature higher than the highest operating temperature of the power semiconductor module 1. For example, each of the first resin member 30 and the second resin member 33 may have a glass transition temperature of 150° C. or higher.

The third resin member 40 seals the semiconductor device 15, the first resin member 30, and the second resin member 33. The third resin member 40 further seals at least a part of the conductive wire 20. The third resin member 40 may seal the entire part of the conductive wire 20. The third resin member 40 is made of, for example, an insulating resin such as silicone gel.

The third tensile elastic modulus of the third resin member 40 may be smaller than the first tensile elastic modulus of the first resin member 30 and the second tensile elastic modulus of the second resin member 33. Therefore, it is possible to prevent the peeling of the third resin member 40 from the semiconductor device 15 due to the difference in thermal expansion coefficient between the third resin member 40 and the semiconductor device 15. The third tensile elastic modulus of the third resin member 40 is measured according to JIS K 6251. The dielectric breakdown strength of the third resin member 40 is greater than the dielectric breakdown strength of the first resin member 30 and the second resin member 33. For example, the third resin member 40 may have a dielectric breakdown strength of 10 kV/mm or more.

As illustrated in FIG. 1, the heat sink 37 is attached to the insulating circuit board 10. Specifically, the conductive plate 13 of the insulating circuit board 10 is bonded to the front surface of the heat sink 37 by using a bonding member (not shown) such as heat transfer grease. The heat generated from the semiconductor device 15 is conducted to the heat sink 37 via the insulating circuit board 10. The heat is dissipated from the heat sink 37 to the outside of the power semiconductor module 1. The heat sink 37 is made of, for example, a metal material such as aluminum (Al).

As illustrated in FIG. 1, the envelope 38 may be attached to a peripheral edge of the front surface of the heat sink 37. The heat sink 37 and the envelope 38 constitute a case 36. The power semiconductor module 1 is a case-type module. The envelope 38 is made of, for example, an insulating resin such as polyphenylene sulfide (PPS) or polybutylene terephthalate (PBT). At least a part of the inner space of the case 36 is filled with the third resin member 40. The power semiconductor module 1 may be a mold-type module that does not include the envelope 38.

Figure 7:
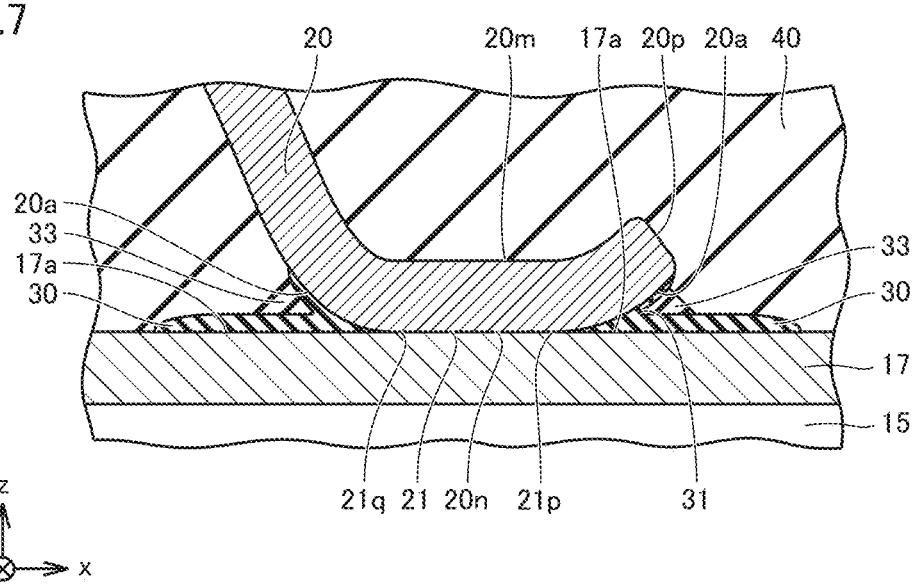
FIG. 7 is a partially enlarged cross-sectional view schematically illustrating a power semiconductor module according to a third modification of the first embodiment taken along a section line VII-VII illustrated in FIG. 8.
Figure 8:
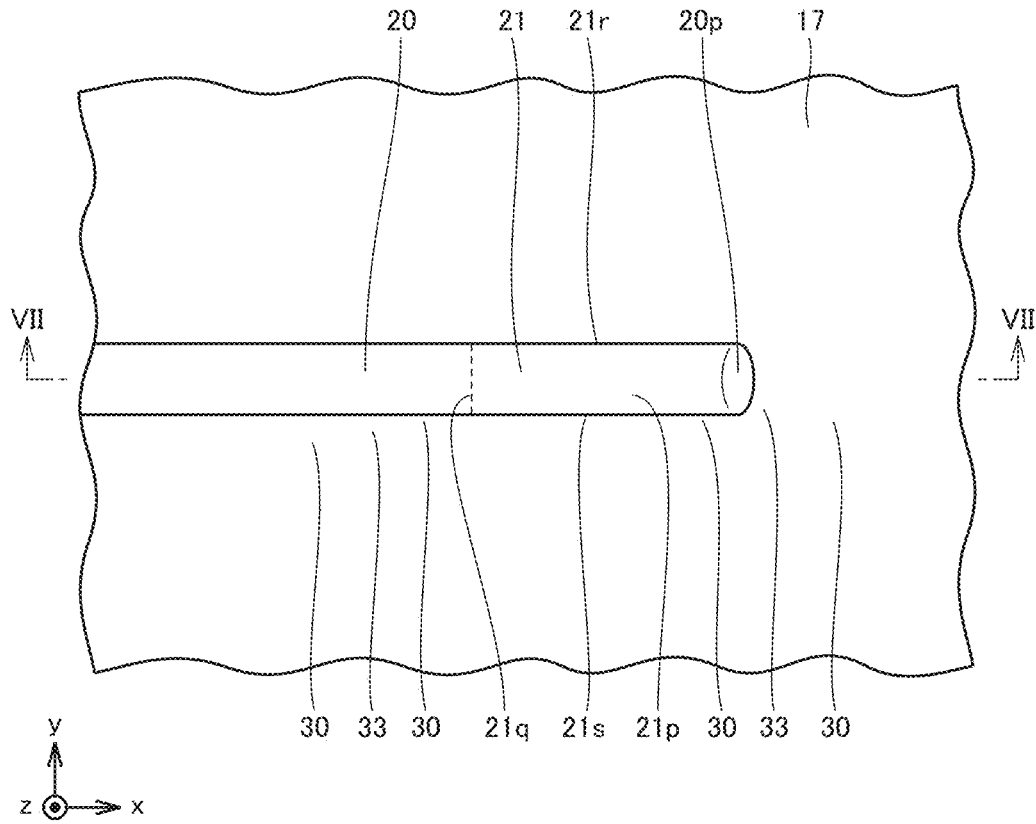
FIG. 8 is a partially enlarged plan view schematically illustrating a power semiconductor module according to a third modification of the first embodiment.

As illustrated in the third modification of the present embodiment in FIGS. 7 and 8, the first resin member 30 may selectively cover the two end portions 21p and 21q of the bonding section 21. The two end portions 21p and 21q of the bonding section 21 may be selectively double sealed by the first resin member 30 and the second resin member 33. A part of the side portions 21r and 21s of the bonding section 21 connecting the two end portions 21p and 21q of the bonding section 21 to each other may be exposed from the first resin member 30. A part of the outer peripheral surface of the bonding section 21 may be exposed from the first resin member 30.

Figure 9:
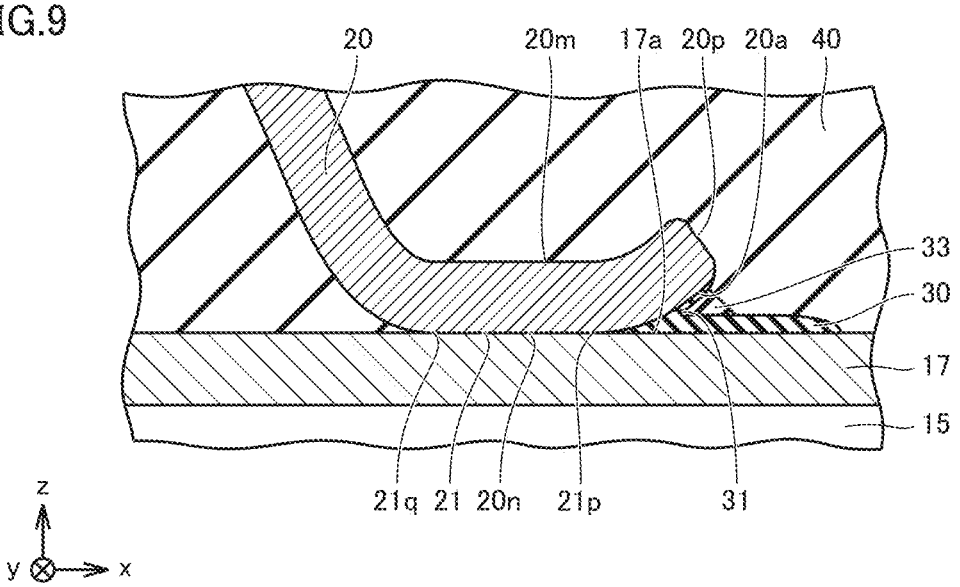
FIG. 9 is a partially enlarged cross-sectional view schematically illustrating a power semiconductor module according to a fourth modification of the first embodiment taken along a section line IX-IX illustrated in FIG. 10.
Figure 10:
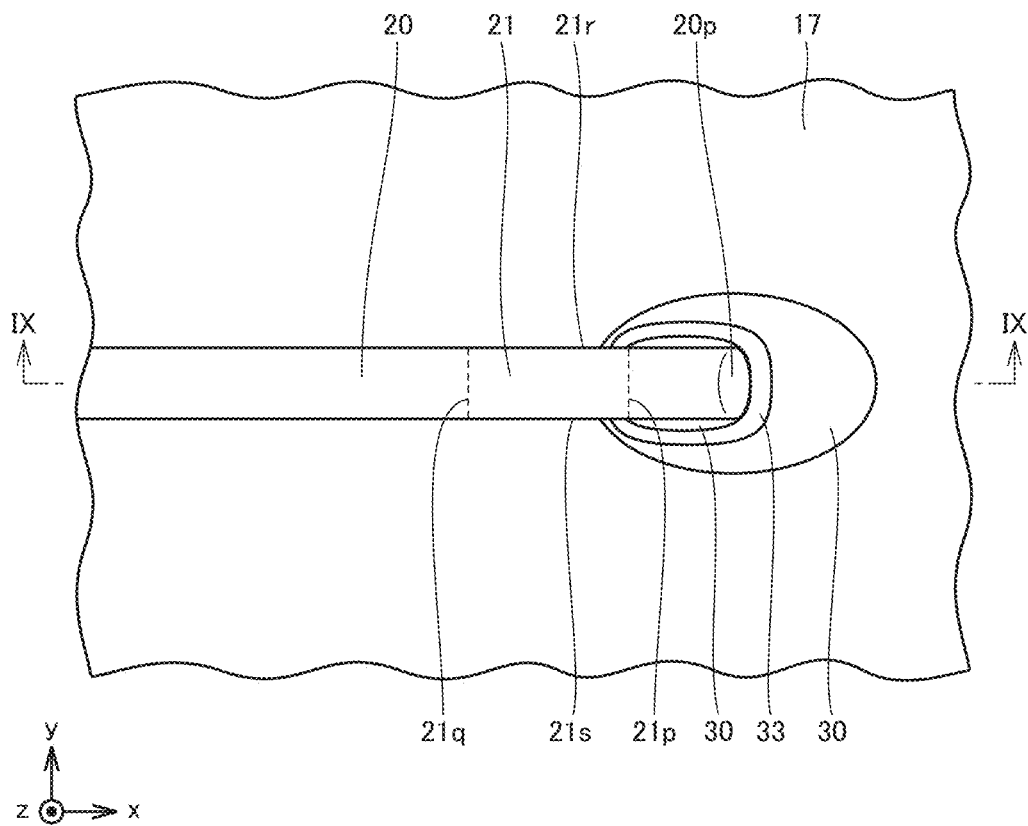
FIG. 10 is a partially enlarged plan view schematically illustrating a power semiconductor module according to a fourth modification of the first embodiment.

As illustrated in the fourth modification of the present embodiment in FIGS. 9 and 10, at least one end portion of the two end portions 21p and 21q of the bonding section 21 covered with the first resin member 30 may be one of the two end portions 21p and 21q of the bonding section 21. In the fourth modification of the present embodiment, the first resin member 30 selectively covers one end portion 21p of the two end portions 21p and 21q of the bonding section 21. The end portion 21p of the bonding section 21 may be selectively double sealed by the first resin member 30 and the second resin member 33. The end portion 21p of the bonding section 21 is exposed from the first resin member 30. The first resin member 30 may selectively cover the end portion 21q of the end portions 21p and 21q of the bonding section 21. The end portion 21q of the bonding section 21 may be selectively double sealed by the first resin member 30 and the second resin member 33.

Figure 11:
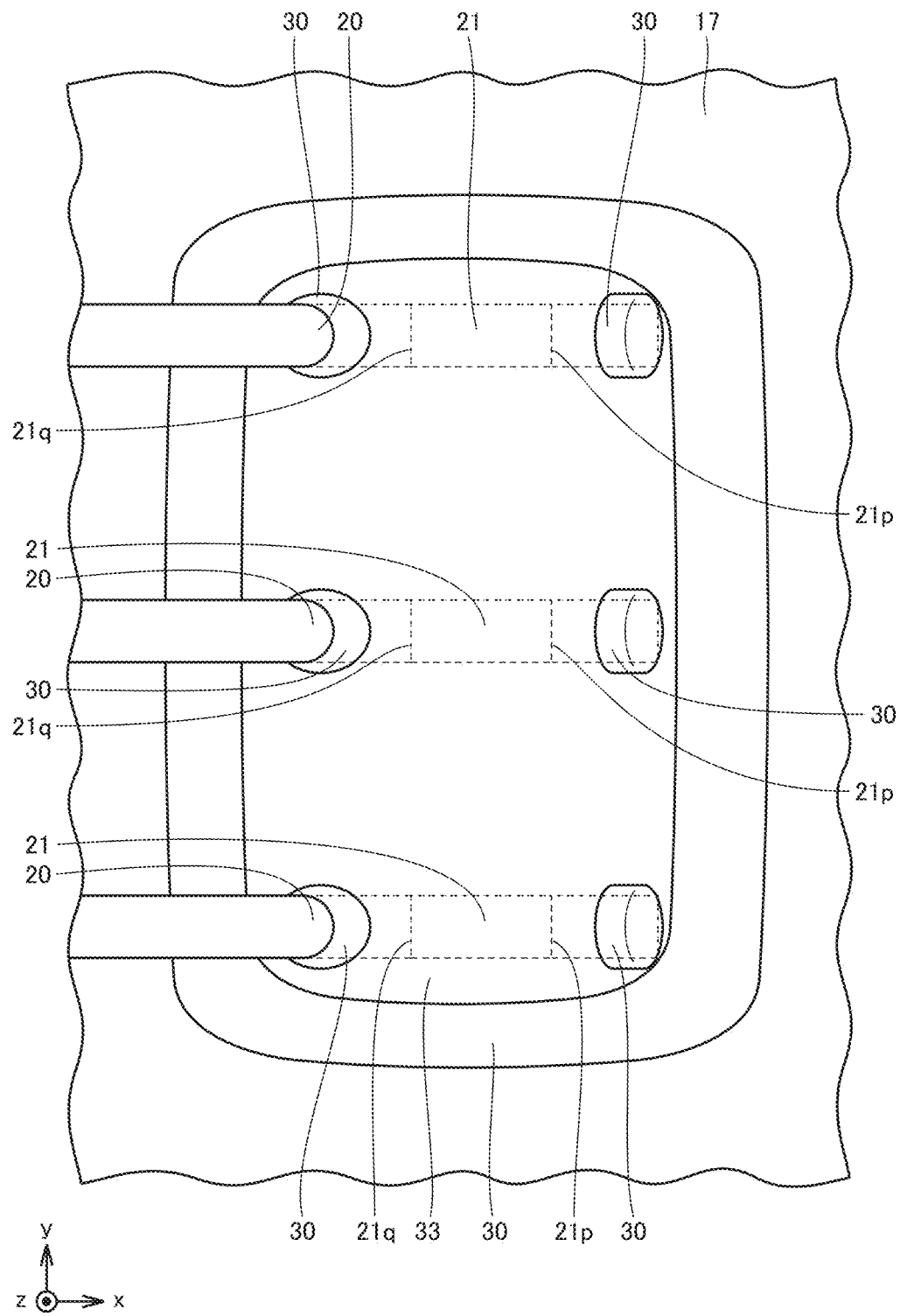
FIG. 11 is a partially enlarged plan view schematically illustrating a power semiconductor module according to a fifth modification of the first embodiment.
Figure 12:
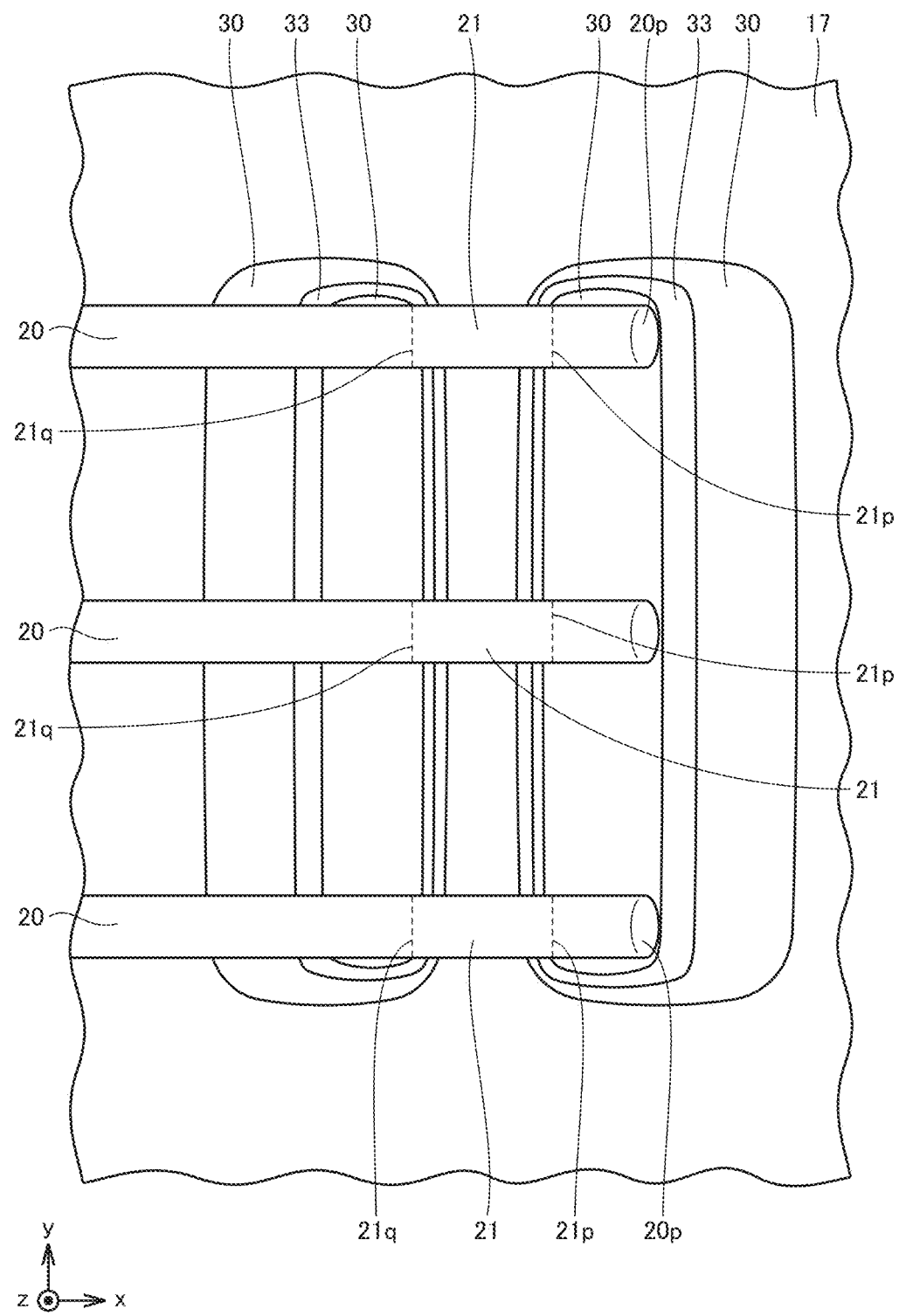
FIG. 12 is a partially enlarged plan view schematically illustrating a power semiconductor module according to a sixth modification of the first embodiment.

As illustrated in the fifth modification of the present embodiment in FIG. 11 and as illustrated in the sixth modification of the present embodiment in FIG. 12, at least one conductive wire 20 may be a plurality of conductive wires 20. The first resin member 30 and the second resin member 33 may be formed across the plurality of conductive wires 20. The first resin member 30 and the second resin member 33 may be formed across a plurality of bonding sections 21 formed between the plurality of conductive wires 20 and the front electrode 17. The plurality of bonding sections 21 may be double sealed by the first resin member 30 and the second resin member 33 as one unit.

As illustrated in the sixth modification of the present embodiment in FIG. 12, the first resin member 30 may selectively cover the two end portions 21p and 21q of the bonding section 21. The end portion 21p of the plurality of bonding sections 21 may be selectively double sealed by the first resin member 30 and the second resin member 33. The end portion 21q of the plurality of bonding sections 21 may be selectively double sealed by the first resin member 30 and the second resin member 33. A part of the side portions 21r and 21s of the bonding section 21 connecting the two end portions 21p and 21q of the bonding section 21 to each other may be exposed from the first resin member 30. A part of the outer peripheral surface of the bonding section 21 may be exposed from the first resin member 30.

A method of manufacturing the power semiconductor module 1 according to the present embodiment will be described. The method of manufacturing the power semiconductor module 1 of the present embodiment includes a bonding step S1, a first sealing step S2, a second sealing step S3, and a third sealing step S4.

In the bonding step S1, the semiconductor device 15 is bonded to the insulating circuit board 10. For example, the back electrode 16 of the semiconductor device 15 is bonded to the conductive circuit pattern 12 by using a bonding member (not shown) such as solder or a sintered body of metal fine particles. The conductive wire 20 is bonded to the front electrode 17 of the semiconductor device 15 at the bonding section 21. For example, the conductive wire 20 is bonded to the front electrode 17 of the semiconductor device 15 and the conductive circuit pattern 12 by using a wire bonder. The insulating circuit board 10 is bonded to the heat sink 37. For example, the conductive plate 13 of the insulating circuit board 10 is bonded to the front surface of the heat sink 37 by using a bonding member (not shown) such as heat transfer grease.

Further, the envelope 38 may be bonded to the heat sink 37.

In the first sealing step S2, the first resin member 30 is formed. For example, a solution obtained by dispersing a resin material in a solvent is coated on the conductive wire 20 and the first surface 17a of the front electrode 17. The conductive wire 20 and the front electrode 17 coated with the solution are heated to evaporate the solvent and cure the resin material. Thus, the first resin member 30 is formed on the first surface 17a of the front electrode 17 and the second surface 20a of the conductive wire 20. The resin material constituting the first resin member 30 may be coated by using a dispenser, or may be coated by electrostatic coating or electrodeposition coating. The coating of the resin material by using a dispenser is economical. Electrostatic coating or electrodeposition coating may easily coat the resin material to a narrow region.

In the second sealing step S3, the second resin member 33 is formed. For example, a liquid resin material is coated on the first resin member 30. After the liquid resin material is cured, the second resin member 33 is formed. In the third sealing step S4, the third resin member 40 is formed. For example, a liquid resin is coated on the first resin member 30, the second resin member 33, at least a part of the conductive wire 20, the semiconductor device 15, and the insulating circuit board 10. After the liquid resin material is cured, the third resin member 40 is formed. Thus, the power semiconductor module 1 is obtained.

Hereinafter, effects of the power semiconductor module 1 of the present embodiment will be described.

The power semiconductor module 1 of the present embodiment includes a semiconductor device 15, at least one conductive wire 20, a first resin member 30, a second resin member 33, and a third resin member 40. The semiconductor device 15 includes a front electrode 17. The at least one conductive wire 20 is bonded to the front electrode 17 at the bonding section 21. The third resin member 40 seals the semiconductor device 15, the first resin member 30, and the second resin member 33. The first resin member 30 extends along the first surface 17a of the front electrode 17 and the second surface 20a of the conductive wire 20, and is bent at at least one end portion of the two end portions 21p and 21q of the bonding section 21 in the longitudinal direction of the conductive wire 20. The first surface 17a is connected to at least one end portion of the two end portions 21p and 21q of the bonding section 21, and faces the conductive wire 20. The second surface 20a is connected to at least one end portion of the two end portions 21p and 21q of the bonding section 21, and faces the front electrode 17. The first resin member 30 covers at least one end portion of the two end portions 21p and 21q of the bonding section 21, the first surface 17a, and the second surface 20a. The second resin member 33 covers the bent portion 31 of the first resin member 30. The first break elongation of the first resin member 30 is greater than the second break elongation of the second resin member 33. The first break strength of the first resin member 30 is greater than the second break strength of the second resin member 33. The second tensile elastic modulus of the second resin member 33 is greater than the first tensile elastic modulus of the first resin member 30.

The first break elongation of the first resin member 30 is greater than the second break elongation of the second resin member 33. The first break strength of the first resin member 30 is greater than the second break strength of the second resin member 33. Therefore, even when the power semiconductor module 1 is subjected to a heat cycle, the first resin member 30 may continue to fix the conductive wire 20 to the front electrode 17 of the semiconductor device 15 without breaking. The second tensile elastic modulus of the second resin member 33 is greater than the first tensile elastic modulus of the first resin member 30. Therefore, when the power semiconductor module 1 is subjected to a heat cycle, the second resin member 33 may prevent the deformation of the conductive wire 20 caused by the difference in thermal expansion coefficient between the semiconductor device 15 and the conductive wire 20. The second resin member 33 may prevent the first resin member 30 from be broken by the deformation of the conductive wire 20 at the bent portion 31 of the first resin member 30 where it is most likely to break. As a result, it is possible to prevent cracks from occurring in the bonding section 21. Thereby, the reliability of the power semiconductor module 1 is improved.

In the power semiconductor module 1 of the present embodiment, the third tensile elastic modulus of the third resin member 40 is smaller than the first tensile elastic modulus of the first resin member 30 and the second tensile elastic modulus of the second resin member 33. Therefore, when the power semiconductor module 1 is subjected to a heat cycle, it is possible to prevent the disconnection of the conductive wire 20. Thereby, the reliability of the power semiconductor module 1 is improved.

In the power semiconductor module 1 of the present embodiment, the first break elongation of the first resin member 30 is 20% or more, and the first break strength of the first resin member 30 is 100 MPa or more. Thus, even when the power semiconductor module 1 is subjected to a heat cycle, the first resin member 30 may continue to fix the conductive wire 20 to the front electrode 17 of the semiconductor device 15 without breaking. As a result, it is possible to prevent cracks from occurring in the bonding section 21. Thereby, the reliability of the power semiconductor module 1 is improved.

In the power semiconductor module 1 of the present embodiment, the second tensile elastic modulus of the second resin member 33 is 5 GPa or more. Thus, when the power semiconductor module 1 is subjected to a heat cycle, the second resin member 33 may reduce the deformation of the conductive wire 20 caused by the difference in thermal expansion coefficient between the semiconductor device 15 and the conductive wire 20. The second resin member 33 may prevent the breaking of the first resin member 30 caused by the deformation of the conductive wire 20. As a result, it is possible to prevent cracks from occurring in the bonding section 21. Thereby, the reliability of the power semiconductor module 1 is improved.

In the power semiconductor module 1 of the present embodiment, the second resin member 33 contains a filler at a concentration higher than that in the first resin member 30. Therefore, it is possible to increase the first break elongation and the first break strength of the first resin member 30 as well as the second tensile elastic modulus of the second resin member 33. As a result, it is possible to prevent cracks from occurring in the bonding section 21. Thereby, the reliability of the power semiconductor module 1 is improved.

In the power semiconductor module 1 of the present embodiment, the distance d between at least one end portion of the two end portions 21p and 21q of the bonding section 21 and the bent portion 31 of the first resin member 30 in the longitudinal direction (the first direction, i.e., the x direction) of the conductive wire 20 is 150 μm or less. Therefore, the solvent is easily evaporated during the formation of the first resin member 30, preventing the solvent from remaining in the first resin member 30. As a result, the first resin member 30 is prevented from becoming brittle. In addition, when the first resin member 30 is formed by curing the resin material, it is possible to reduce the stress in the first resin member 30. Therefore, even when the power semiconductor module 1 is subjected to a heat cycle, the first resin member 30 may continue to fix the conductive wire 20 to the front electrode 17 of the semiconductor device 15 without breaking. As a result, it is possible to prevent cracks from occurring in the bonding section 21. Thereby, the reliability of the power semiconductor module 1 is improved.

In the power semiconductor module 1 of the present embodiment, at least one end portion of the two end portions 21p and 21q of the bonding section 21 is the two end portions 21p and 21q of the bonding section 21. Since the two end portions 21p and 21q of the bonding section 21 are double sealed by the first resin member 30 and the second resin member 33, it is possible to prevent cracks from occurring in the bonding section 21. Thereby, the reliability of the power semiconductor module 1 is improved.

In the power semiconductor module 1 of the present embodiment, the first resin member 30 selectively covers the two end portions 21p and 21q of the bonding section 21. As a result, it is possible to reduce the amount of the first resin member 30 to be used, which makes it possible to reduce the cost of the power semiconductor module 1.

In the power semiconductor module 1 of the present embodiment, the minimum height $h_1$ of the top portion 33p of the second resin member 33 located between the first surface 17a and the second surface 20a relative to the first surface 17a is greater than a half of the minimum thickness $D_1$ of the conductive wire 20 located on the bonding section 21. Therefore, when the power semiconductor module 1 is subjected to a heat cycle, it is possible for the second resin member 33 to prevent the deformation of the conductive wire 20 caused by the difference in thermal expansion coefficient between the semiconductor device 15 and the conductive wire 20. The second resin member 33 prevents the breaking of the first resin member 30 caused by the deformation of the conductive wire 20. As a result, it is possible to prevent cracks from occurring in the bonding section 21. Thereby, the reliability of the power semiconductor module 1 is improved.

In the power semiconductor module 1 of the present embodiment, the maximum thickness $h_2$ of the second resin member 33 located on the third surface 20m of the conductive wire 20 is equal to or less than twice the maximum thickness $D_2$ of the conductive wire 20 located on the bonding section 21. The third surface 20m is opposite to the fourth surface 20n of the conductive wire 20 in contact with the front electrode 17 at the bonding section 21. Since the second resin member 33 is not formed excessively thick, when the power semiconductor module 1 is subjected to a heat cycle, it is possible to prevent the disconnection of the conductive wire 20 caused by the difference in thermal expansion coefficient between the semiconductor device 15, the conductive wire 20, and the second resin member 33. Thereby, the reliability of the power semiconductor module 1 is improved.

In the power semiconductor module 1 of the present embodiment, the at least one conductive wire 20 is a plurality of conductive wires 20. The first resin member 30 and the second resin member 33 are formed across the plurality of conductive wires 20. The contact area between the first resin member 30 and the front electrode 17 is increased, and thereby, the first resin member 30 is more strongly adhered to the front electrode 17. Thus, the first resin member 30 and the second resin member 33 are less likely to be peeled off from the front electrode 17 and at least one end portion of the two end portions 21p and 21q of the bonding section 21. As a result, it is possible to prevent cracks from occurring in the bonding section 21. Thereby, the reliability of the power semiconductor module 1 is improved.

Second Embodiment

A power semiconductor module 1b according to a second embodiment will be described with reference to FIGS. 13 to 15, FIGS. 19 to 21 and FIGS. 25 to 27. The power semiconductor module 1b of the present embodiment has the same configuration as that of the power semiconductor module 1 of the first embodiment, but is mainly different in the following points.

Figure 13:
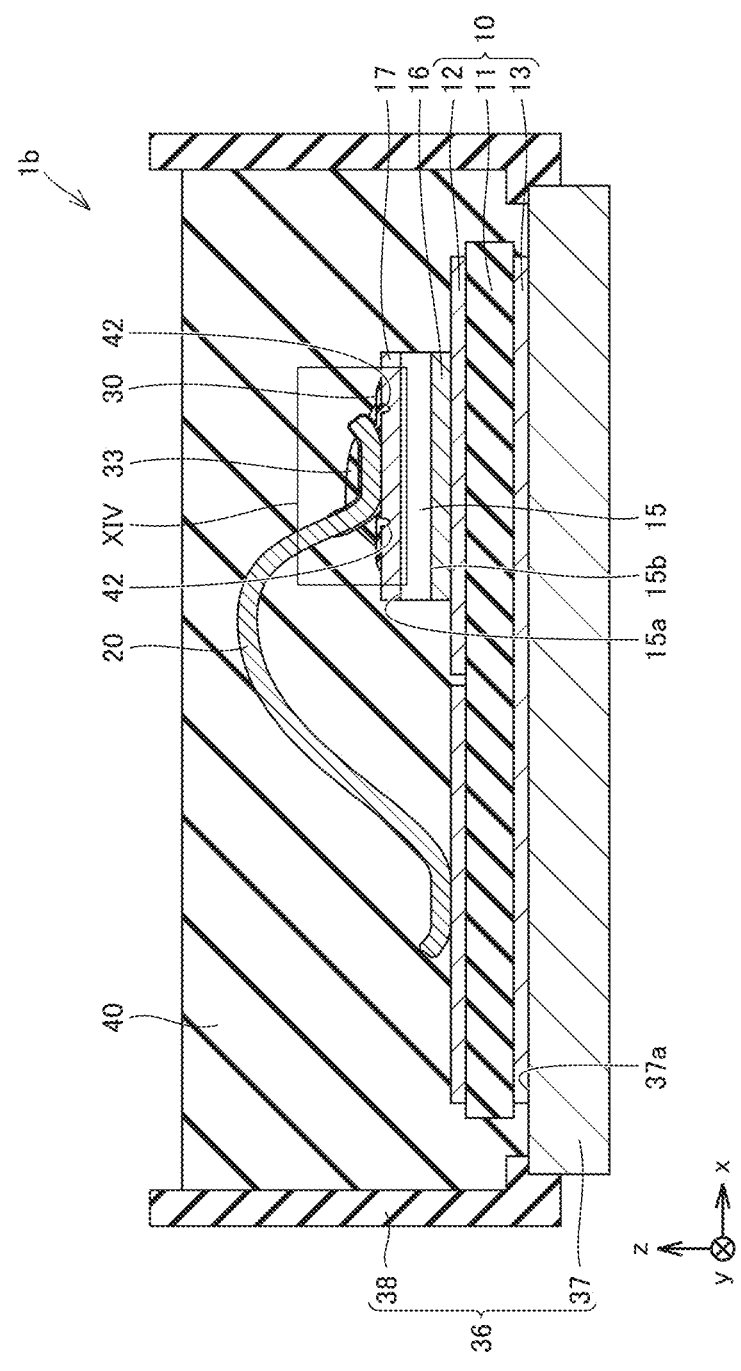
FIG. 13 is a cross-sectional view schematically illustrating a power semiconductor module according to a second embodiment.
Figure 14:
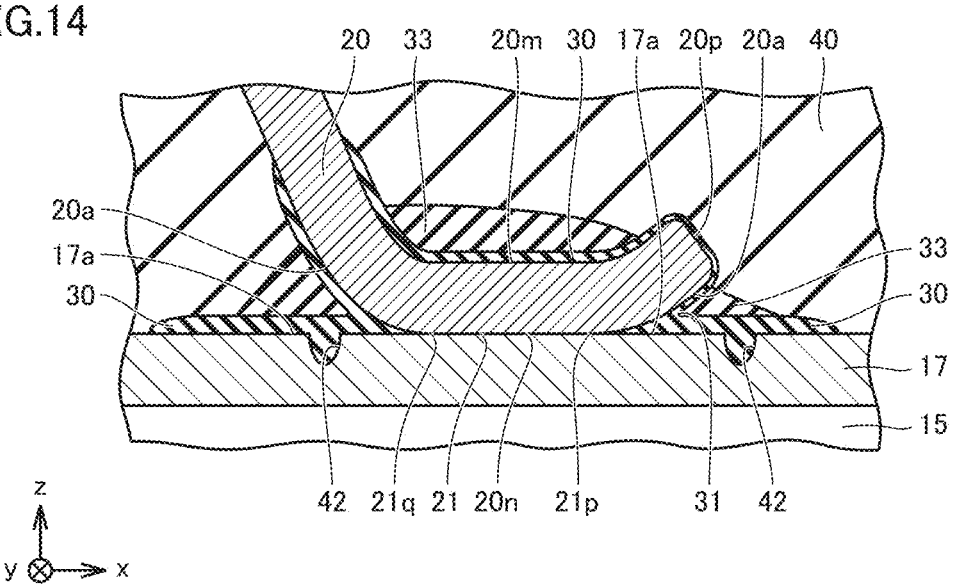
FIG. 14 is a partially enlarged cross-sectional view schematically illustrating the power semiconductor module according to the second embodiment in a region XIV illustrated in FIG. 13, which is a schematic partially enlarged cross-sectional view schematically illustrating the power semiconductor module according to the second embodiment taken along a cross-sectional line XIV-XIV illustrated in FIG. 15.
Figure 15:
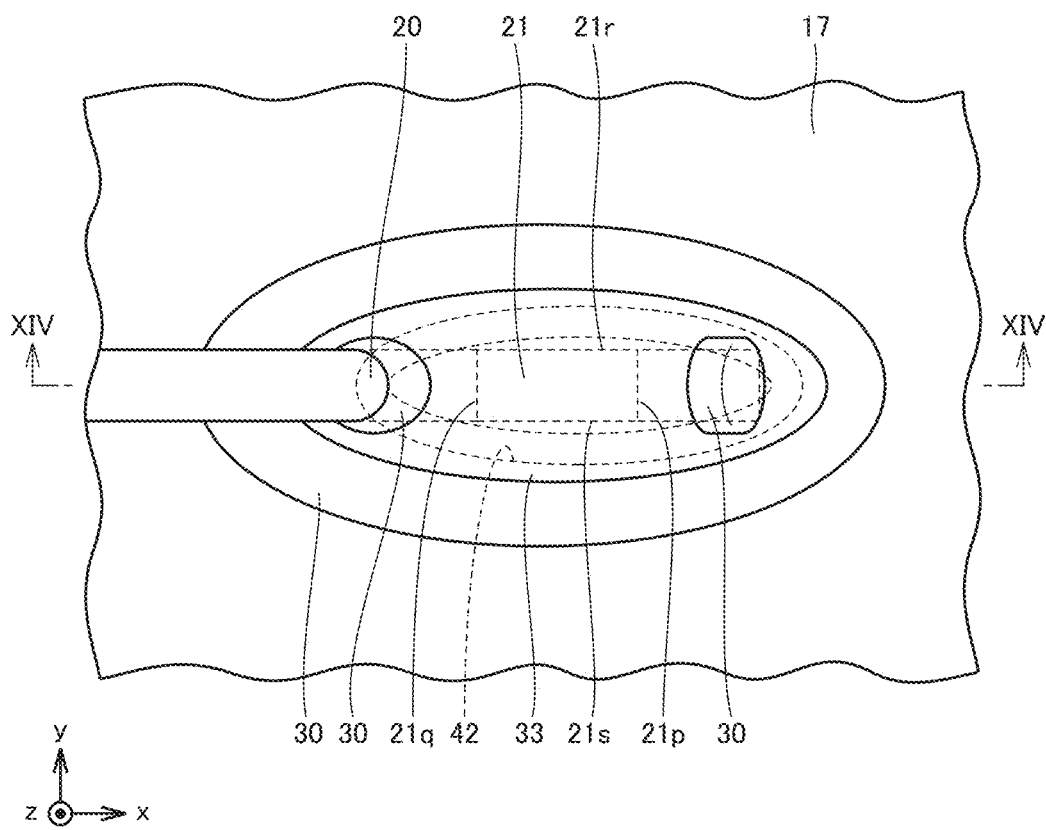
FIG. 15 is a partially enlarged cross-sectional view schematically illustrating the power semiconductor module according to the second embodiment.

As illustrated in FIGS. 13 to 15, in the power semiconductor module 1b, the front electrode 17 is formed with a recess 42 around the junction 21. The recess 42 is formed on the front electrode 17. The recess 42 may be formed on the first surface 17a of the front electrode 17. The recess 42 is filled with the first resin member 30. As illustrated in FIG. 15, the recess 42 is formed around the bonding section 21. Specifically, in a plan view of the front electrode 17, the recess 42 may be formed to surround the bonding section 21. More specifically, in a plan view of the front electrode 17, the recess 42 may be formed to continuously surround the bonding section 21.

An example method of manufacturing the power semiconductor module 1b of the present embodiment will be described with reference to FIGS. 16 to 18. The example method of manufacturing the power semiconductor module 1b of the present embodiment includes the same steps as the method of manufacturing the power semiconductor module 1 of the first embodiment, but is mainly different in that it further includes a step S5 of forming a recess.

Figure 16:
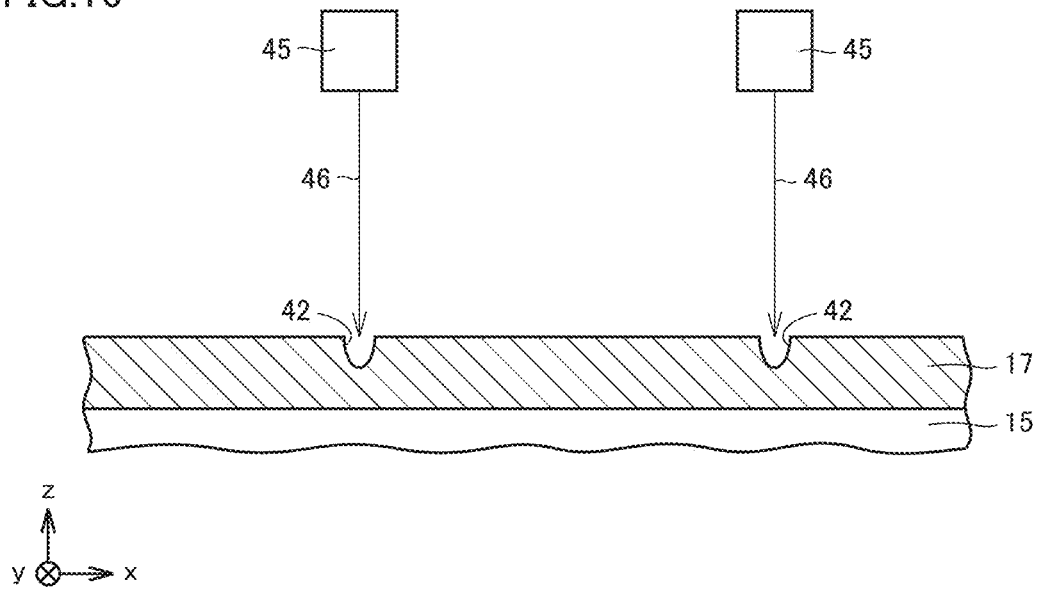
FIG. 16 is a partially enlarged cross-sectional view schematically illustrating one step of a method of manufacturing the power semiconductor module according to the second embodiment.

As illustrated in FIG. 16, the step S5 of forming a recess is performed before the bonding step S1. In the step S5 of forming a recess, a recess 42 is formed on the front electrode 17 of the semiconductor device 15. Specifically, the recess 42 is formed by irradiating the front electrode 17 with a laser beam 46 from a laser source 45. The laser beam 46 is irradiated to a region around the front electrode 17, i.e., the bonding section 21. The laser source 45 is, for example, a carbon dioxide laser.

Figure 17:
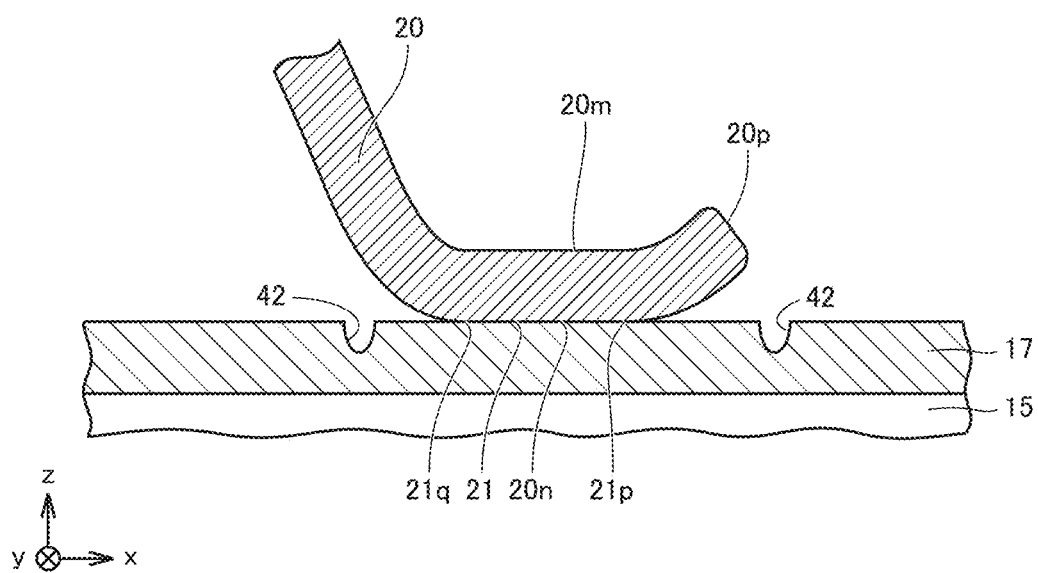
FIG. 17 is a partially enlarged cross-sectional view schematically illustrating a step subsequent to the step illustrated in FIG. 16 in the method of manufacturing the power semiconductor module according to the second embodiment.
Figure 18:
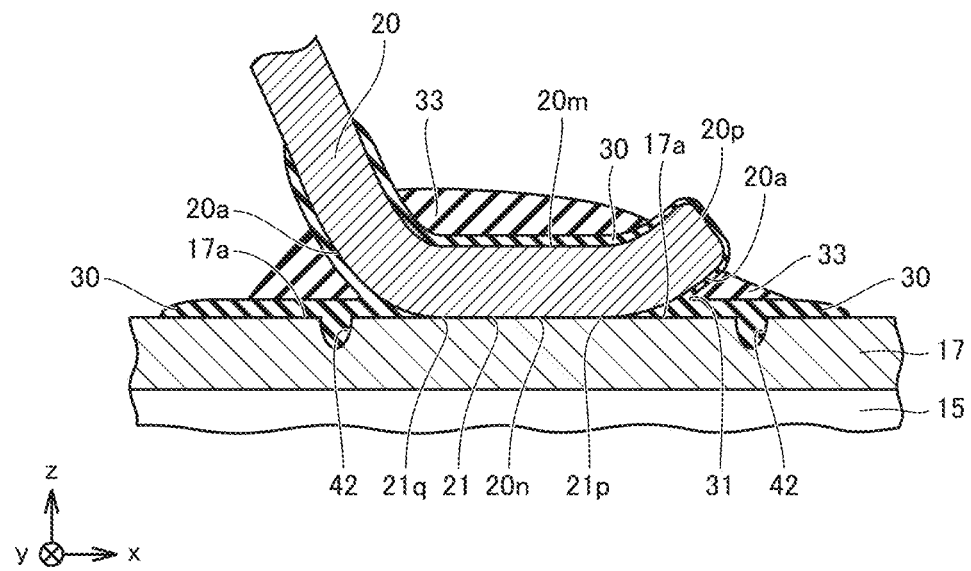
FIG. 18 is a partially enlarged cross-sectional view schematically illustrating a step subsequent to the step illustrated in FIG. 17 in the method of manufacturing the power semiconductor module according to the second embodiment.

As illustrated in FIG. 17, the bonding step S1 is performed after the step S5 of forming a recess. For example, after the step S5 of forming a recess, the step of bonding the conductive wire 20 to the front electrode 17 is performed. As illustrated in FIG. 18, after the bonding step S1, the first sealing step S2 and the second sealing step S3 are performed. Subsequently, the third sealing step S4 is performed. Thus, the power semiconductor module 1b illustrated in FIGS. 13 to 15 is obtained.

Figure 19:
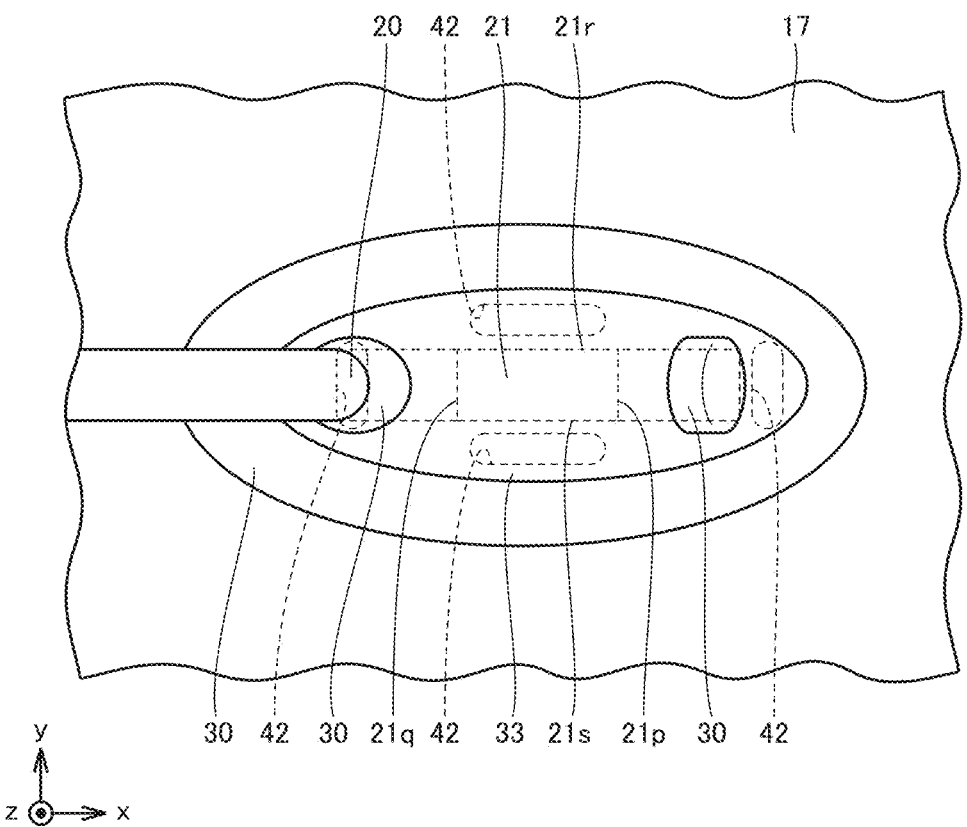
FIG. 19 is a partially enlarged plan view schematically illustrating a power semiconductor module according to a first modification of the second embodiment.
Figure 20:
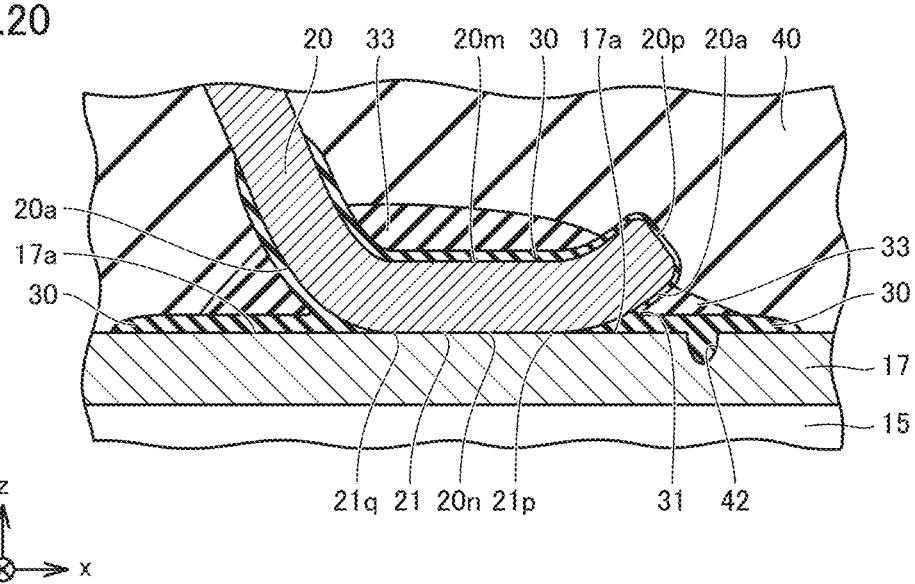
FIG. 20 is a partially enlarged cross-sectional view schematically illustrating a power semiconductor module according to a second modification of the second embodiment taken along a cross-sectional line XX-XX illustrated in FIG. 21.
Figure 21:
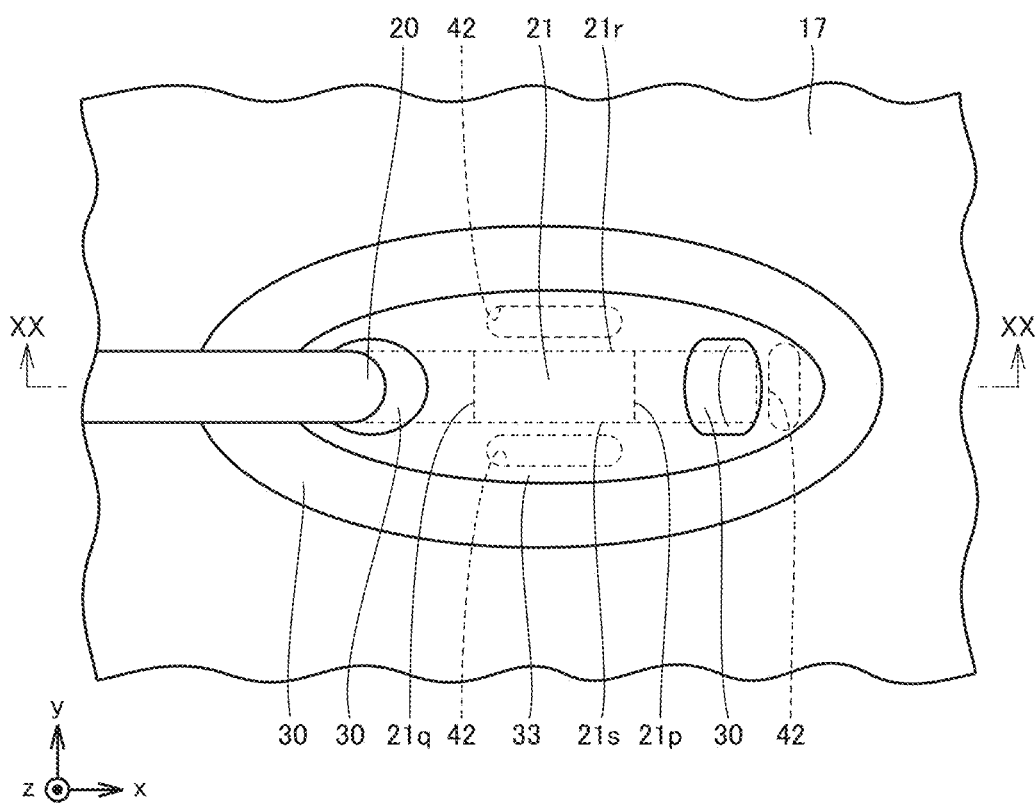
FIG. 21 is a partially enlarged plan view schematically illustrating a power semiconductor module according to a second modification of the second embodiment.

As illustrated in the first modification of the present embodiment in FIG. 19 and the second modification of the present embodiment in FIGS. 20 and 21, in a plan view of the front electrode 17, the recess 42 may be formed into a plurality of separate parts. In a plan view of the front electrode 17, the recesses 42 may be formed to discretely surround the bonding section 21.

As illustrated in the second modification of the present embodiment in FIG. 21, the recess 42 may not be formed on a portion around the bonding section 21. The recess 42 is not required to be formed to surround the entire bonding section 21. In the second modification of the present embodiment, the recess 42 is not formed on a portion of the front electrode 17 opposed to the end portion 21q of the bonding section 21.

Figure 22:
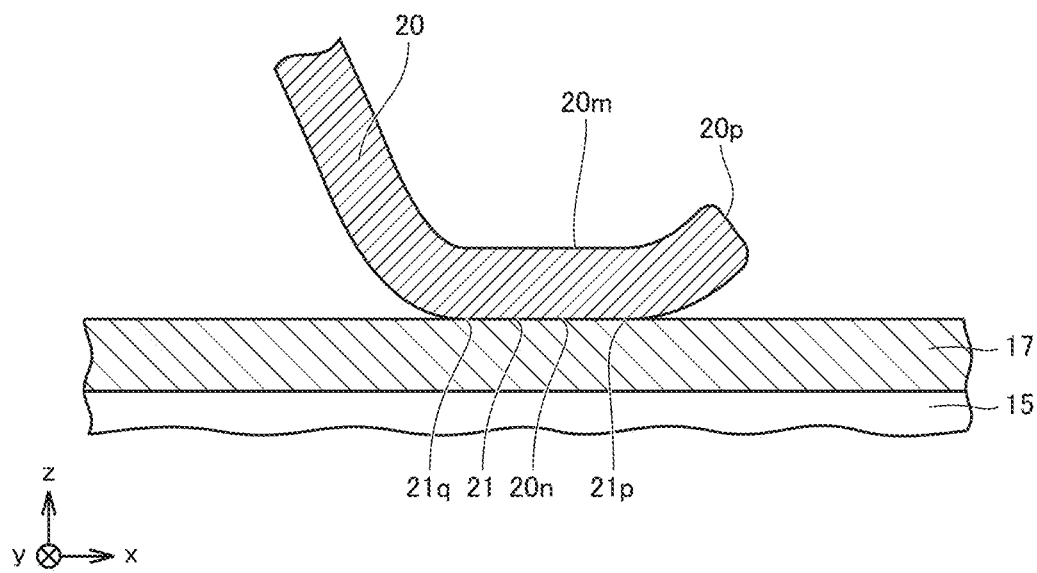
FIG. 22 is a partially enlarged cross-sectional view schematically illustrating one step of a method of manufacturing a power semiconductor module according to a second modification of the second embodiment.
Figure 23:
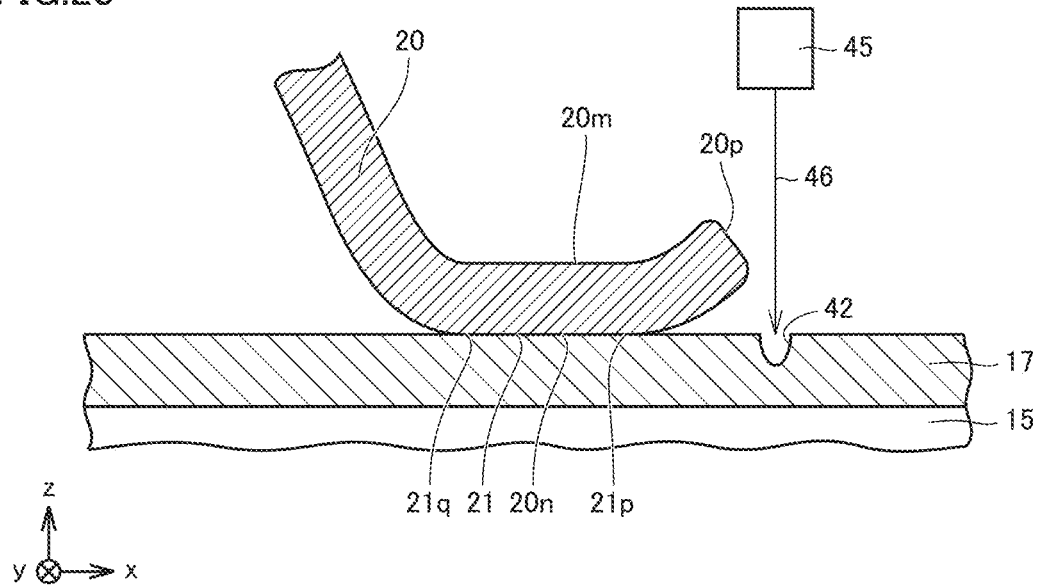
FIG. 23 is a partially enlarged cross-sectional view schematically illustrating a step subsequent to the step illustrated in FIG. 22 in the method of manufacturing the power semiconductor module of the second modification of the second embodiment.
Figure 24:
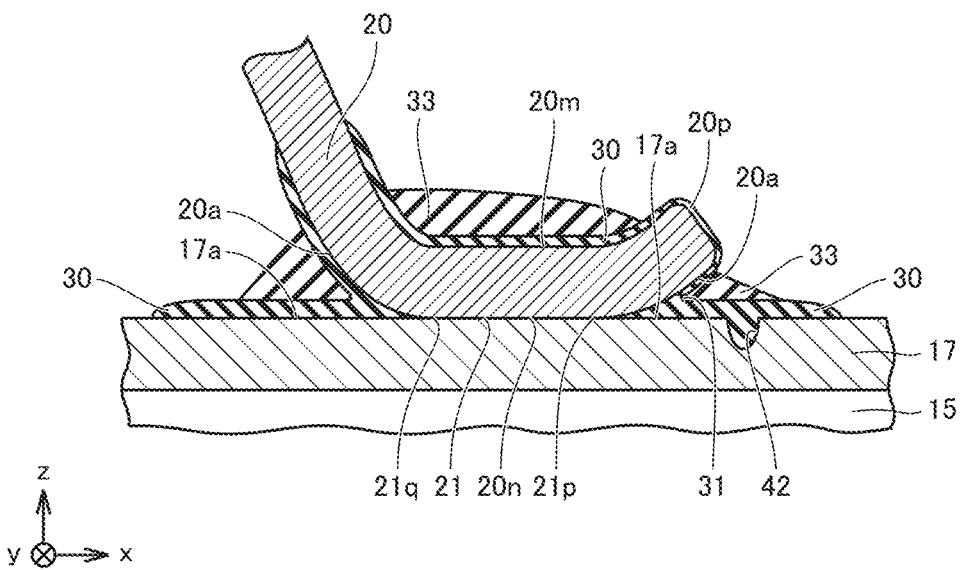
FIG. 24 is a partially enlarged cross-sectional view schematically illustrating a step subsequent to the step illustrated in FIG. 23 in the method of manufacturing the power semiconductor module of the second modification of the second embodiment.

An example method of manufacturing the power semiconductor module 1b according to the second modification of the present embodiment will be described with reference to FIGS. 22 to 24. The example method of manufacturing the power semiconductor module 1b of the second modification of the present embodiment includes the same steps as the example method of manufacturing the power semiconductor module 1b of the present embodiment illustrated in FIGS. 16 to 18, but is mainly different in the following points.

In the example method of manufacturing the power semiconductor module 1b according to the second modification of the present embodiment, the step S5 of forming a recess is performed at least after the conductive wire 20 is bonded to the front electrode 17 in the bonding step S1. The step S5 of forming a recess may be performed after the entire bonding step S1 is completed. As illustrated in FIG. 22, the conductive wire 20 is bonded to the front electrode 17. Then, as illustrated in FIG. 23, the step S5 of forming a recess is performed. Specifically, the recess 42 is formed by irradiating the laser beam 46 from the laser source 45 to a region of the front electrode 17 around the bonding section 21. As illustrated in FIG. 24, the first sealing step S2 and the second sealing step S3 are performed. Subsequently, the third sealing step S4 is performed. Thus, the power semiconductor module 1b according to the second modification of the present embodiment is obtained.

Figure 25:
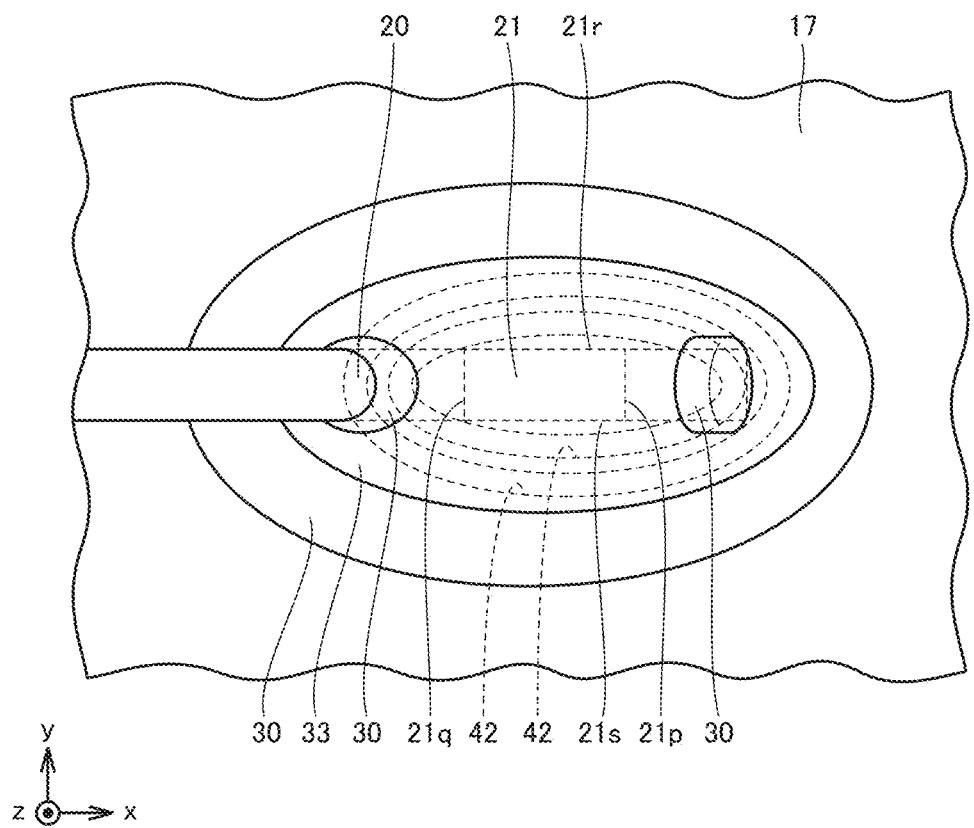
FIG. 25 is a partially enlarged plan view schematically illustrating a power semiconductor module according to a third modification of the second embodiment.
Figure 26:
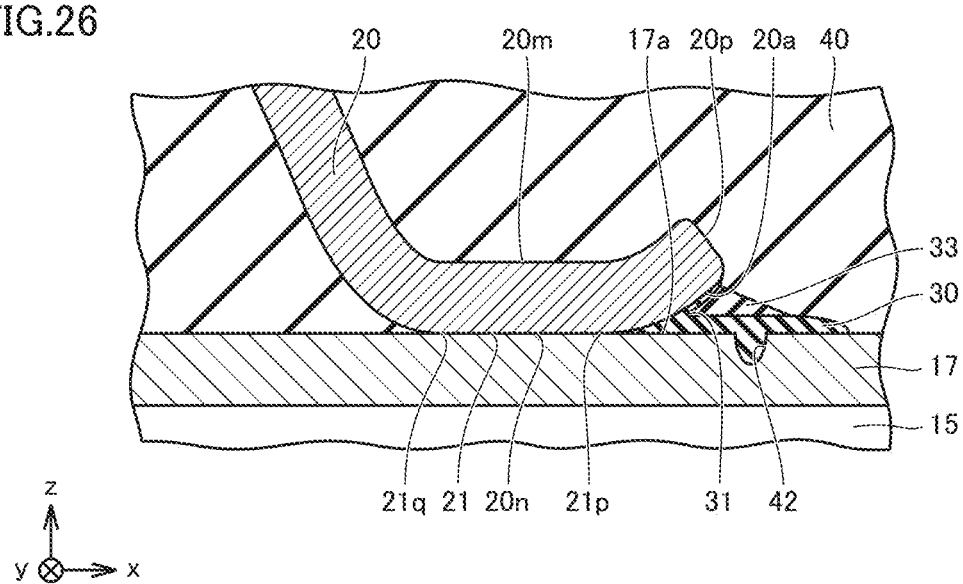
FIG. 26 is a partially enlarged cross-sectional view schematically illustrating a power semiconductor module according to a fourth modification of the second embodiment.

As illustrated in the third modification of the present embodiment in FIG. 25, in a plan view of the front electrode 17, the recess 42 may be formed to surround the bonding section 21 for multiple times. As illustrated in the fourth modification of the present embodiment in FIG. 26, at least one end portion of the two end portions 21p and 21q of the bonding section 21 covered with the first resin member 30 may be one of the two end portions 21p and 21q of the bonding section 21. In the fourth modification of the present embodiment, the first resin member 30 selectively covers the end portion 21p of the end portions 21p and 21q of the bonding section 21. The first resin member 30 may selectively cover the end portion 21q of the end portions 21p and 21q of the bonding section 21.

Figure 27:
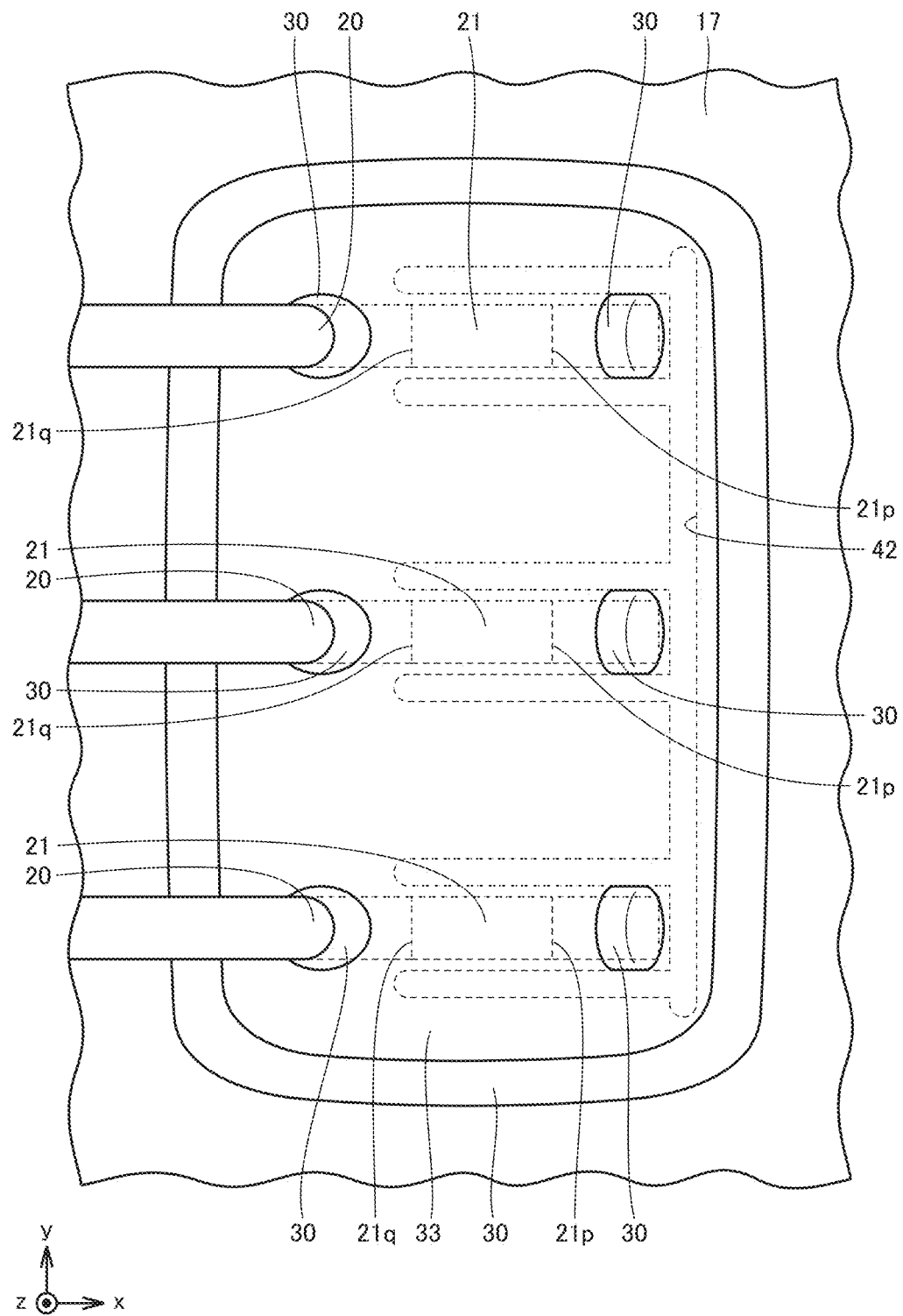
FIG. 27 is a partially enlarged plan view schematically illustrating a power semiconductor module according to a fifth modification of the second embodiment.

As illustrated in the fifth modification of the present embodiment in FIG. 27, at least one conductive wire 20 may be a plurality of conductive wires 20. The first resin member 30 and the second resin member 33 may be formed across the plurality of conductive wires 20. The recess 42 is formed around each of the plurality of bonding sections 21. The recesses 42 formed around each of the plurality of bonding sections 21 may be connected to each other.

The power semiconductor module 1b of the present embodiment has the following effects in addition to the effects of the power semiconductor module 1 of the first embodiment.

In the power semiconductor module 1b of the present embodiment, the front electrode 17 is formed with a recess 42 around the bonding section 21. The recess 42 is filled with the first resin member 30.

When the power semiconductor module 1b is subjected to a heat cycle, due to the difference in thermal expansion coefficient between the conductive wire 20 and the semiconductor device 15, the peeling of the first resin member 30 from the front electrode 17 may advance from the end portion of the first resin member 30 toward the bonding section 21. Since the recess 42 is filled with the first resin member 30, the direction of the peeling of the first resin member 30 from the front electrode 17 is changed by the recess 42, and is directed toward the bottom of the recess 42. Thereby, it is possible to prevent the peeling of the first resin member 30 from the front electrode 17 from reaching the bonding section 21. Even when the power semiconductor module 1b is subjected to a heat cycle, the first resin member 30 may continue to fix the conductive wire 20 to the front electrode 17 of the semiconductor device 15. As a result, it is possible to prevent cracks from occurring in the bonding section 21. Thereby, the reliability of the power semiconductor module 1b is improved.

In the power semiconductor module 1b of the present embodiment, the recess 42 is formed to surround the bonding section 21 in a plan view of the front electrode 17. Therefore, it is possible to further prevent the peeling of the first resin member 30 from the front electrode 17 from reaching the bonding section 21. Even when the power semiconductor module 1b is subjected to a heat cycle, the first resin member 30 may continue to fix the conductive wire 20 to the front electrode 17 of the semiconductor device 15. As a result, it is possible to prevent cracks from occurring in the bonding section 21. Thereby, the reliability of the power semiconductor module 1b is improved.

Third Embodiment

Figure 28:
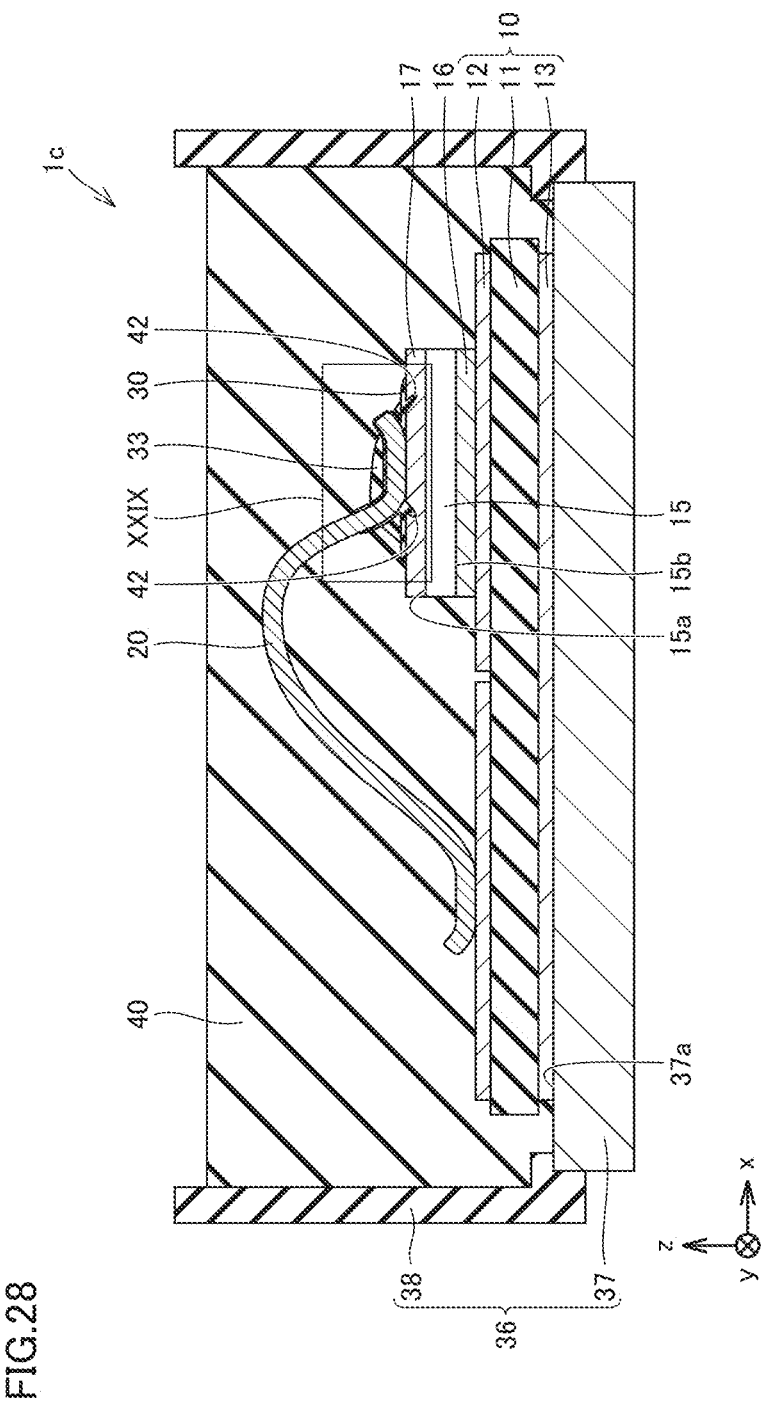
FIG. 28 is a cross-sectional view schematically illustrating a power semiconductor module according to a third embodiment.
Figure 29:
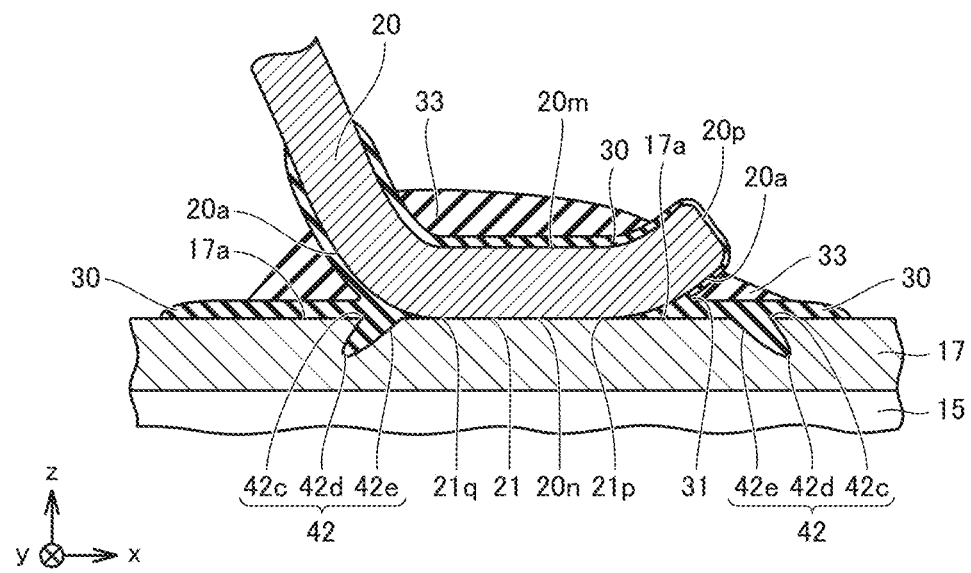
FIG. 29 is a partially enlarged cross-sectional view schematically illustrating the power semiconductor module according to the third embodiment in a region XXIX illustrated in FIG. 28.

The power semiconductor module 1c according to a third embodiment will be described with reference to FIGS. 28 and 29. The power semiconductor module 1c of the present embodiment has the same configuration as the power semiconductor module 1b of the second embodiment, but is mainly different in the shape of the recess 42.

In the power semiconductor module 1c, the recess 42 has an opening 42c, a bottom 42d, and a side face 42e connecting the opening 42c and the bottom 42d. The recess 42 extends in a direction inclined with respect to the normal direction of the first surface 17a of the front electrode 17. At least a part of the side face 42e of the recess 42 is inclined with respect to the normal direction of the first surface 17a of the front electrode 17. The entire side face 42e of the recess 42 may be inclined with respect to the normal direction of the first surface 17a of the front electrode 17. The inclined part of the side face 42e of the recess 42 may be connected to the opening 42c of the recess 42. In a plan view of the front electrode 17, at least a part of the bottom 42d or the side face 42e is located farther away from the bonding section 21 than the opening 42c. In a plan view of the front electrode 17, the recess 42 is inclined with respect to the normal direction of the first surface 17a of the front electrode 17 in such a manner that the distance between the bottom 42d of the recess 42 and the bonding section 21 is greater than the distance between the opening 42c of the recess 42 and the bonding section 21.

Figure 30:
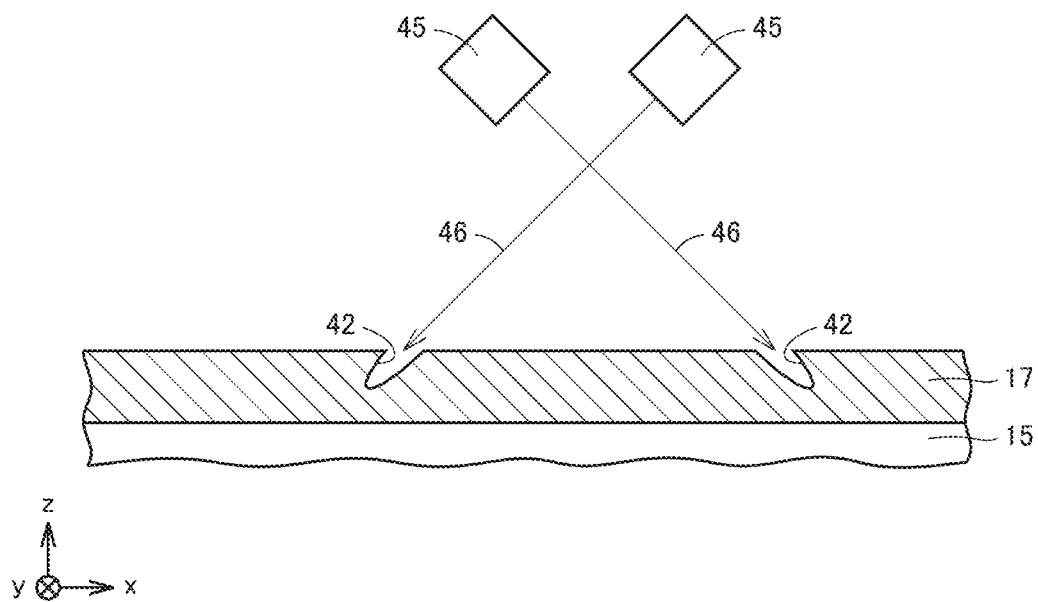
FIG. 30 is a partially enlarged cross-sectional view schematically illustrating one step of a method of manufacturing the power semiconductor module according to the third embodiment.

A method of manufacturing the power semiconductor module 1c according to the third embodiment will be described with reference to FIG. 30. The method of manufacturing the power semiconductor module 1c according to the present embodiment includes the same steps as the method of manufacturing the power semiconductor module 1b according to the second embodiment, but is mainly different in the step S5 of forming a recess.

In the step S5 of forming a recess according to the present embodiment, the recess 42 is formed to be inclined with respect to the normal direction of the first surface 17a of the front electrode 17. The inclined recess 42 is formed by irradiating a laser beam 46 in a direction inclined with respect to the normal direction of the first surface 17a of the front electrode 17 around a region of the front electrode 17, i.e., the bonding section 21. For example, by inclining the laser source 45 with respect to the normal direction of the first surface 17a of the front electrode 17, the first surface 17a of the front electrode 17 is irradiated with the laser beam 46 from a direction inclined with respect to the normal direction of the first surface 17a of the front electrode 17.

The power semiconductor module 1c of the present embodiment has the following effects in addition to the effects of the power semiconductor module 1b of the second embodiment.

In the power semiconductor module 1c of the present embodiment, the recess 42 has an opening 42c, a bottom 42d, and a side face 42e connecting the opening 42c and the bottom 42d. In a plan view of the front electrode 17, at least a part of the bottom 42d or the side face 42e is located farther away from the bonding section 21 than the opening 42c. The direction of the peeling of the first resin member 30 from the front electrode 17 is changed more greatly by the inclined recess 42. Therefore, it is possible to prevent the peeling of the first resin member 30 from the front electrode 17 from reaching the bonding section 21. Even when the power semiconductor module 1c is subjected to a heat cycle, the first resin member 30 may continue to fix the conductive wire 20 to the front electrode 17 of the semiconductor device 15. As a result, it is possible to prevent cracks from occurring in the bonding section 21. Thereby, the reliability of the power semiconductor module 1c is improved.

Fourth Embodiment

In the present embodiment, any one of the power semiconductor modules 1, 1b, and 1c according to the first to third embodiments is applied to a power converter. A power converter 200 of the present embodiment is not particularly limited, and however, the power converter 200 will be described as a three-phase inverter in the following.

Figure 31:
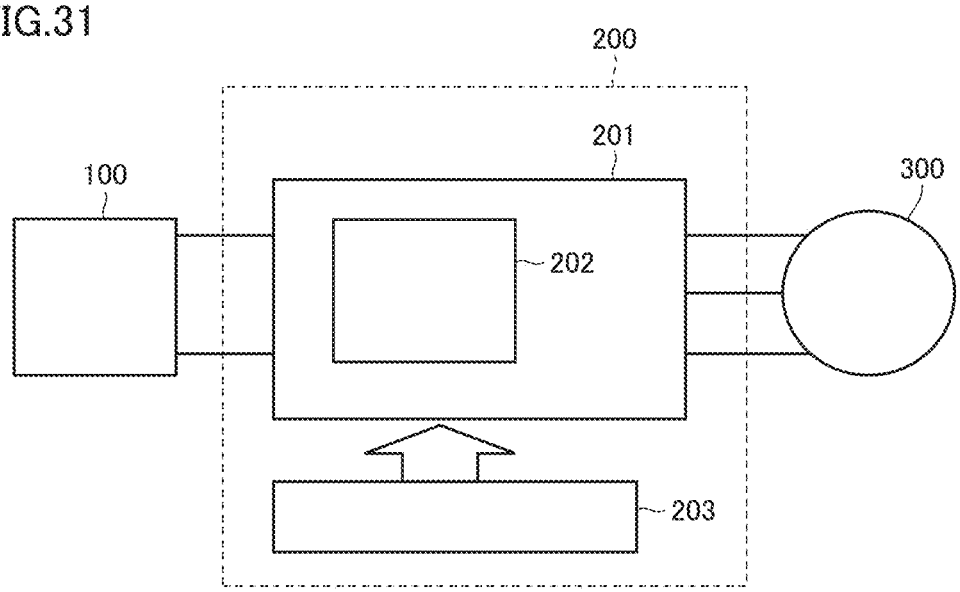
FIG. 31 is a block diagram illustrating a configuration of a power conversion system according to a fourth embodiment.

A power conversion system illustrated in FIG. 31 includes a power supply 100, a power converter 200, and a load 300. The power source 100 is a DC power source, and supplies DC power to the power converter 200. The power source 100 is not particularly limited, and may be, for example, a DC system, a solar cell or a storage battery, or may be a rectifier circuit or an AC/DC converter connected to an AC system. The power supply 100 may be a DC/DC converter that converts DC power output from a DC system into another DC power.

The power converter 200 is a three-phase inverter connected between the power supply 100 and the load 300, and is configured to convert DC power supplied from the power supply 100 into AC power and supply the AC power to the load 300. As illustrated in FIG. 31, the power converter 200 includes a main conversion circuit 201 that converts DC power into AC power and outputs the AC power, and a control circuit 203 that outputs a control signal for controlling the main conversion circuit 201 to the main conversion circuit 201.

The load 300 is a three-phase electric motor driven by the AC power supplied from the power converter 200. The load 300 is not particularly limited, and it may be an electric motor mounted on various electric devices such as an electric motor used in a hybrid vehicle, an electric vehicle, a railroad vehicle, an elevator, or an air conditioner.

Hereinafter, the power converter 200 will be described in detail. The main conversion circuit 201 includes a switching element (not shown) and a return diode (not shown). When the switching element switches the voltage supplied from the power supply 100, the main conversion circuit 201 converts the DC power supplied from the power supply 100 into AC power and supplies the AC power to the load 300. Although the main conversion circuit 201 may have various specific circuit configurations, the main conversion circuit 201 according to the present embodiment is a two-level three-phase full bridge circuit, and may be constituted by six switching elements and six freewheel diodes connected in antiparallel to the switching elements, respectively. Any one of the power semiconductor modules 1, 1b and 1c according to the first to third embodiments may be applied to at least one end portion of the switching elements and the freewheel diodes of the main conversion circuit 201. Every two switching elements of the six switching elements are connected in series to form an upper arm and a lower arm, and each of the upper and lower arms forms each phase (U phase, V phase, and W phase) of the full bridge circuit. The output terminals of the upper and lower arms, that is, the three output terminals of the main conversion circuit 201 are connected to the load 300.

The main conversion circuit 201 includes a driving circuit (not shown) for driving each switching element. The driving circuit may be built in the semiconductor module 202 or may be provided separately from the semiconductor module 202. The driving circuit generates a driving signal for driving the switching elements provided in the main conversion circuit 201, and supplies the driving signal to the control electrodes of the switching elements of the main conversion circuit 201. Specifically, in accordance with a control signal from the control circuit 203, a driving signal for turning on each switching element and a driving signal for turning off each switching element are output to the control electrode of each switching elements. In the case of maintaining the switching element in the ON state, the driving signal is a voltage signal (ON signal) equal to or greater than the threshold voltage of the switching element, and in the case of maintaining the switching element in the OFF state, the driving signal is a voltage signal (OFF signal) equal to or lower than the threshold voltage of the switching element.

The control circuit 203 controls the switching elements of the main conversion circuit 201 so as to supply a desired power to the load 300. Specifically, a time (ON time) to turn on each switching element of the main conversion circuit 201 is calculated based on the power to be supplied to the load 300. For example, the main conversion circuit 201 may be controlled by a pulse width modulation (PWM) control which modulates the ON time of the switching element based on the voltage to be output. Then, a control command (control signal) is output to the drive circuit included in the main conversion circuit 201 so that an ON signal is output to each switching element which should be turned on at each time or an OFF signal is output to each switching element which should be turned off at each time. The driving circuit outputs an ON signal or an OFF signal to the control electrode of each switching element as the driving signal in accordance with the control signal.

In the power converter 200 according to the present embodiment, any one of the power semiconductor modules 1, 1b and 1c according to the first to third embodiments is applied as the semiconductor module 202 included in the main conversion circuit 201. Therefore, the reliability of the power converter 200 according to the present embodiment is improved.

In the present embodiment, as an example, it is described that the present invention is applied to a two-level three-phase inverter, but the present invention is not limited thereto, the present invention may be applied to various power converters. Although the power converter according to the present embodiment is a two-level power converter, the power converter according to the present embodiment may be a three-level power converter or a multi-level power converter. When the power converter supplies power to a single-phase load, the present invention may be applied to a single-phase inverter. When the power converter supplies power to a DC load or the like, the present invention may be applied to a DC/DC converter or an AC/DC converter.

The power converter to which the present invention is applied is not limited to the case where the load is an electric motor, and may be incorporated in, for example, a power supply for an electric discharge machine or a laser machine, or a power supply for an induction cooker or a non-contact power supply system. The power converter to which the present invention is applied may be used as a power conditioner for a solar power generation system, a power storage system, or the like.

It should be understood that the first to fourth embodiments disclosed herein are illustrative and non-restrictive in all respects. At least two of the first to fourth embodiments disclosed herein may be combined unless they are inconsistent to each other. The scope of the present invention is defined by the terms of the claims rather than the description of the embodiments above and is intended to include any modifications within the scope and meaning equivalent to the terms of the claims.

REFERENCE SIGNS LIST 1, 1b, 1c: power semiconductor module; 10: insulating circuit board; 11: insulating board; 12: conductive circuit pattern; 13: conductive plate; 15: semiconductor device; 16: back electrode; 17: front electrode; 17a: first surface; 20: conductive wire; 20a: second surface; 20m: third surface; 20n: fourth surface; 20p: end; 21: bonding section; 21p, 21q: end portion; 21r, 21s: side portion; 30: first resin member; 31: bend; 33: second resin member; 33p: top portion; 36: case; 37: heat sink; 38: envelope; 40: third resin member; 42c: opening; 42d: bottom; 42e: side face; 45: laser source; 46: laser beam; 100: power supply; 200: power converter; 201: main conversion circuit; 202: semiconductor module; 203: control circuit; 300: load

The invention claimed is:

1. A power semiconductor module comprising:
a semiconductor device including a front electrode;
at least one conductive wire bonded to the front electrode at a bonding section;
a first resin member;
a second resin member; and
a third resin member sealing the semiconductor device, the first resin member, and the second resin member, wherein
the first resin member extends along a first surface of the front electrode and a second surface of the conductive wire, and is bent at at least one end portion of two end portions of the bonding section in a longitudinal direction of the conductive wire, the first surface is connected to the at least one end portion of the two end portions of the bonding section and faces the conductive wire, the second surface is connected to the at least one end portion of the two end portions of the bonding section and faces the front electrode,
the first resin member covers the at least one end portion of the two end portions of the bonding section, the first surface, and the second surface,
the second resin member covers a bent portion of the first resin member,
a first break elongation of the first resin member is greater than a second break elongation of the second resin member,
a first break strength of the first resin member is greater than a second break strength of the second resin member, and
a second tensile elastic modulus of the second resin member is greater than a first tensile elastic modulus of the first resin member.

2. The power semiconductor module according to claim 1, wherein
a third tensile elastic modulus of the third resin member is smaller than the first tensile elastic modulus of the first resin member and the second tensile elastic modulus of the second resin member.

3. The power semiconductor module according to claim 1, wherein
the first break elongation of the first resin member is 20% or more, and
the first break strength of the first resin member is 100 MPa or more.

4. The power semiconductor module according to claim 1, wherein
the second resin member contains a filler at a concentration higher than that in the first resin member.

5. The power semiconductor module according to claim 1, wherein
the second tensile elastic modulus of the second resin member is 5 GPa or more.

6. The power semiconductor module according to claim 1, wherein
a distance between the at least one end portion of the two end portions of the bonding section and the bent portion of the first resin member in the longitudinal direction of the conductive wire is 150 µm or less.

7. The power semiconductor module according to claim 1, wherein
the at least one end portion of the two end portions of the bonding section is the two end portions of the bonding section.

8. The power semiconductor module according to claim 7, wherein
the first resin member selectively covers the two end portions of the bonding section.

9. The power semiconductor module according to claim 1, wherein
a minimum height of a top portion of the second resin member located between the first surface and the second surface with respect to the first surface is greater than a half of a minimum thickness of the conductive wire located on the bonding section.

10. The power semiconductor module according to claim 1, wherein
a maximum thickness of the second resin member on a third surface of the conductive wire is equal to or less than twice the maximum thickness of the conductive wire located on the bonding section, and
the third surface is opposite to the fourth surface of the conductive wire in contact with the front electrode at the bonding section.

11. The power semiconductor module according to claim 1, wherein
the at least one conductive wire is a plurality of conductive wires, and
the first resin member and the second resin member are formed across the plurality of conductive wires.

12. The power semiconductor module according to claim 1, wherein
the front electrode is formed with a recess around the bonding section, and
the recess is filled with the first resin member.

13. The power semiconductor module according to claim 12, wherein
the recess is formed to surround the bonding section in a plan view of the front electrode.

14. The power semiconductor module according to claim 12, wherein
the recess has an opening, a bottom, and a side face connecting the opening and the bottom, and
in a plan view of the front electrode, at least a part of the bottom or the side face is located farther away from the bonding section than the opening.

15. A power converter comprising:
a main conversion circuit that includes the power semiconductor module according to claim 1, and converts an input power and outputs the converted power; and
a control circuit that outputs a control signal for controlling the main conversion circuit to the main conversion circuit.

* * * * *